(12) United States Patent
Lee et al.

(10) Patent No.: US 12,207,423 B2
(45) Date of Patent: Jan. 21, 2025

(54) DISPLAY DEVICE

(71) Applicants: Samsung Display Co., Ltd., Yongin-si (KR); INNO6 Inc., Suwon-si (KR)

(72) Inventors: Hyun Chul Lee, Suwon-si (KR); Jeongho Kim, Seoul (KR); Hyungsik Kim, Suwon-si (KR)

(73) Assignees: SAMSUNG DISPLAY CO., LTD., Gyeonggi-Do (KR); INNO6 INC., Gyeonggi-Do (KR)

( * ) Notice: Subject to any disclaimer, the term of this patent is extended or adjusted under 35 U.S.C. 154(b) by 232 days.

(21) Appl. No.: 17/779,998

(22) PCT Filed: Jun. 18, 2020

(86) PCT No.: PCT/KR2020/007880
§ 371 (c)(1),
(2) Date: May 25, 2022

(87) PCT Pub. No.: WO2021/157786
PCT Pub. Date: Aug. 12, 2021

(65) Prior Publication Data

US 2022/0418126 A1 Dec. 29, 2022

(30) Foreign Application Priority Data

Feb. 4, 2020 (KR) .................. 10-2020-0013002

(51) Int. Cl.
*H05K 5/02* (2006.01)
*H10K 59/12* (2023.01)

(52) U.S. Cl.
CPC .......... *H05K 5/0217* (2013.01); *H10K 59/12* (2023.02)

(58) Field of Classification Search
CPC .................... H05K 5/0217; H10K 59/12
USPC ..................................................... 361/807
See application file for complete search history.

(56) References Cited

U.S. PATENT DOCUMENTS

| 8,516,728 | B2 | 8/2013 | Jung |
| 9,756,757 | B2 | 9/2017 | Park et al. |
| 9,836,088 | B2 | 12/2017 | Choi et al. |
| 9,897,293 | B2 | 2/2018 | Xu et al. |
| 10,162,387 | B2 | 12/2018 | Takayanagi et al. |

(Continued)

FOREIGN PATENT DOCUMENTS

| CN | 204300864 U | 4/2015 |
| CN | 105247597 A | 1/2016 |

(Continued)

OTHER PUBLICATIONS

International Search Report—PCT/KR2020/007880 dated Oct. 21, 2020.

*Primary Examiner* — Binh B Tran
(74) *Attorney, Agent, or Firm* — CANTOR COLBURN LLP

(57) ABSTRACT

A display device includes a display module, a first support film disposed under the display module, a second support film disposed under the first support film, a plurality of first support bars disposed on a lower surface of the first support film between the first support film and the second support film, and a plurality of second support bars disposed on an upper surface of the second support film between the first support film and the second support film. The plurality of first support bars and the plurality of second support bars are alternately arranged.

23 Claims, 24 Drawing Sheets

(56) References Cited

U.S. PATENT DOCUMENTS

| | | | |
|---|---|---|---|
| 10,319,263 B2 | 6/2019 | Lee et al. | |
| 10,483,098 B2 | 11/2019 | Um et al. | |
| 10,585,457 B2 | 3/2020 | Park | |
| 10,783,809 B2* | 9/2020 | Kim | G09F 9/301 |
| 10,969,828 B2 | 4/2021 | Kim et al. | |
| 11,140,790 B2 | 10/2021 | Kim et al. | |
| 11,842,659 B2 | 12/2023 | Khachatryan et al. | |
| 2011/0011542 A1* | 1/2011 | Kuroi | G03B 21/58 |
| | | | 160/133 |
| 2016/0155965 A1* | 6/2016 | Kusuura | H10K 71/50 |
| | | | 29/829 |
| 2016/0275830 A1 | 9/2016 | You et al. | |

FOREIGN PATENT DOCUMENTS

| | | |
|---|---|---|
| CN | 106257569 A | 12/2016 |
| CN | 107342373 A | 11/2017 |
| CN | 109215508 A | 1/2019 |
| KR | 1020160068049 | 6/2016 |
| KR | 1020160129669 | 11/2016 |
| KR | 1020170012763 | 2/2017 |
| KR | 101780419 | 10/2017 |
| KR | 1020190141041 | 12/2019 |
| KR | 1020200021580 | 3/2020 |
| WO | 2020013390 A1 | 1/2020 |

* cited by examiner

DISPLAY DEVICE

This application is a national stage application of International application No. PCT/KR2020/007880, filed on Jun. 18, 2020, which claims priority to Korean Application No. 10-2020-0013002, filed on Feb. 4, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

Electronic devices such as smart phones, digital cameras, notebook computers, navigation systems, and smart televisions, which provide images to users, include display devices for displaying images. The display device generates an image and provides the generated image to a user through a display screen.

With a recent development of display device technology, various types of display devices are being developed. In an embodiment, a flexible display device that may be folded or wound is being developed. A flexible display device that may be variously deformed in shape is easy to carry and may improve user convenience.

The flexible display device includes a flexible display module, and the flexible display module may be wound on or unwound from a roller.

SUMMARY

When a flexible display module is unwound, the display module may not be kept flat. Accordingly, a technique for improving the flatness of the unwound display module is desired.

Embodiments of the invention provide a display device for improving the flatness of a display module.

A display device in an embodiment of the invention includes a display module, a first support film disposed under the display module, a second support film disposed under the first support film, a plurality of first support bars disposed on a lower surface of the first support film between the first support film and the second support film, and a plurality of second support bars disposed on an upper surface of the second support film between the first support film and the second support film, wherein the plurality of first support bars and the plurality of second support bars are alternately arranged.

A display device in an embodiment of the invention includes a roller, a display module including a first area wound around the roller and a second area spaced apart from the roller, a first support film disposed under the display module, a plurality of first support bars disposed on a lower surface of the first support film, a second support film disposed under the first support film, and a plurality of second support bars disposed on an upper surface of the second support film, wherein the plurality of first support bars and the plurality of second support bars are spaced apart from each other around the first area, become closer to each other as the plurality of first support bars and the plurality of second support bars are adjacent to the second area, are adjacent to each other under the second area, and are alternately disposed in a same space defined between the first support film and the second support film.

In an embodiment of the invention, as the first support bars disposed on the lower surface of the first support film and the second support bars disposed on the upper surface of the second support film are alternately disposed adjacent to each other, the display module may be more flatly supported by the first and second support bars.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
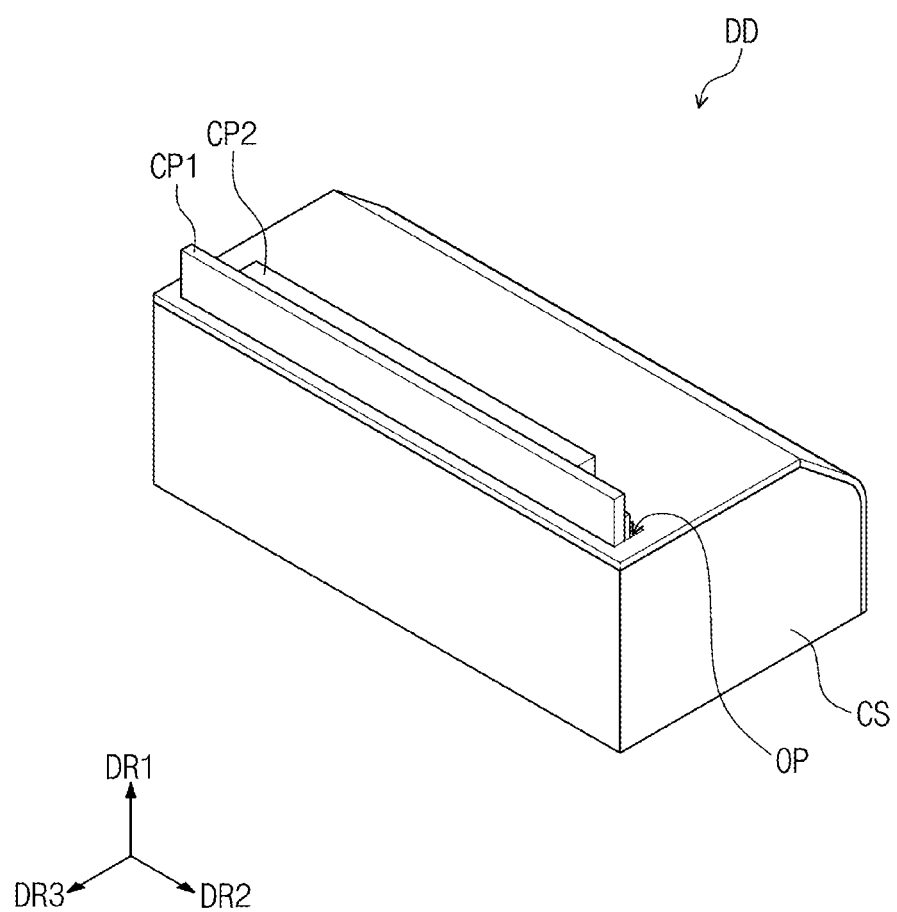
FIG. 1 is a perspective view of an embodiment of a display device according to the invention.

In this specification, when an element (or region, layer, part, etc.) is referred to as being "on", "connected to", or "coupled to" another element, it means that it may be directly placed on/connected to /coupled to other components, or a third component may be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms.

The above terms are used only to distinguish one component from another. For example, a first component may be referred to as a second component and vice versa without departing from the scope of the invention. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as commonly understood by one of ordinary skill in the art to which this invention belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the invention will be described in detail with reference to the drawings.

Figure 2:
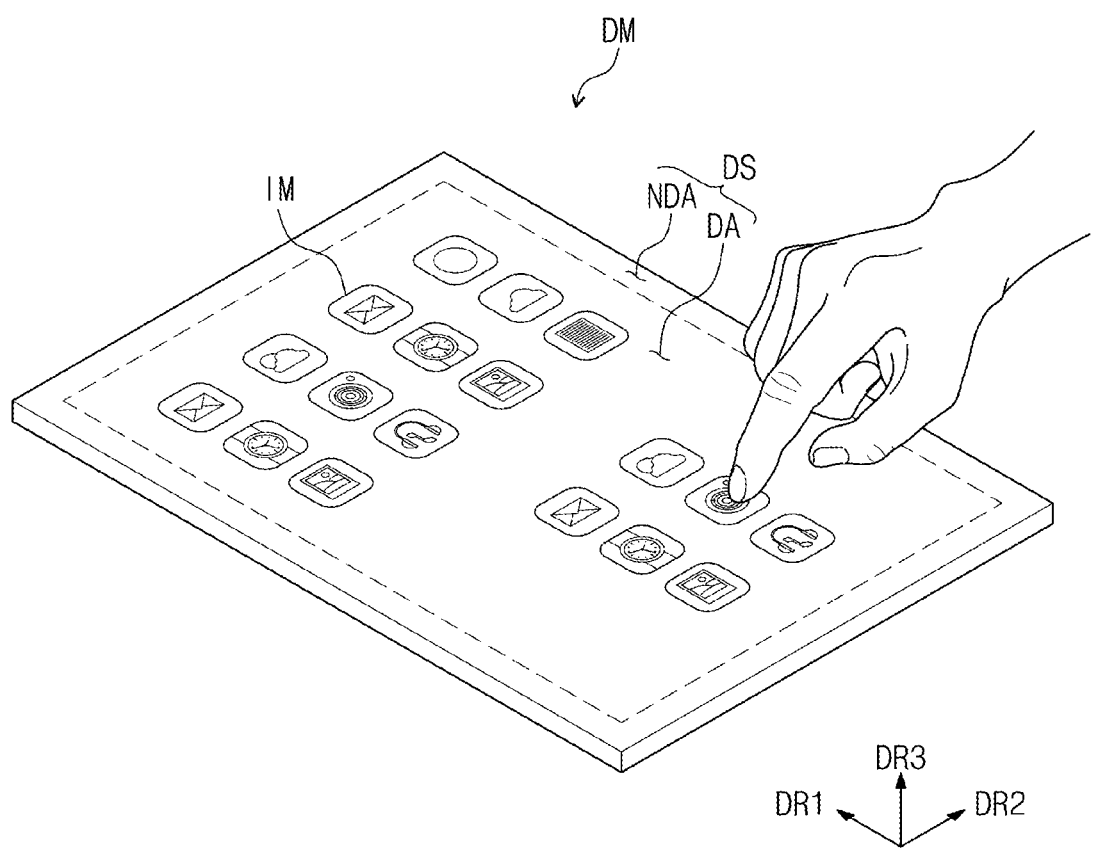
FIG. 2 is a view illustrating a display module accommodated in the case shown in FIG. 1.
Figure 3:
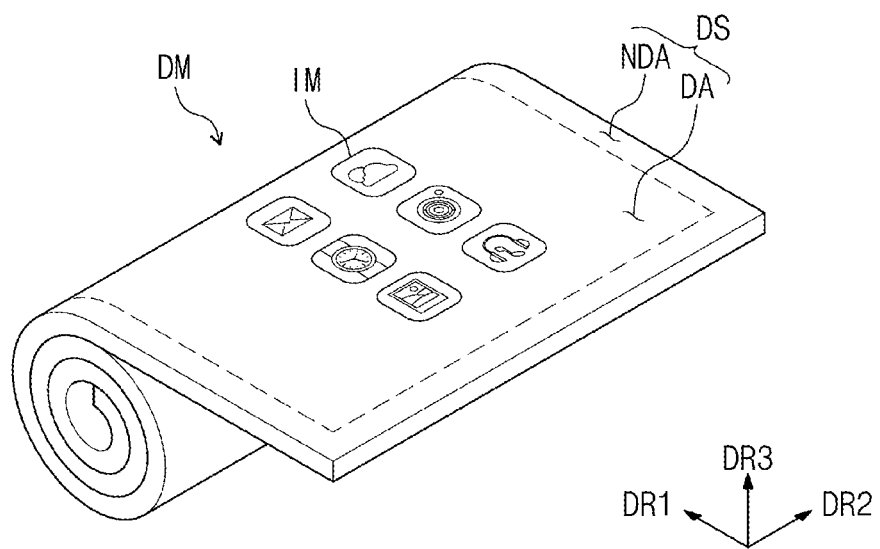
FIG. 3 is a view illustrating a rolling state of the display module shown in FIG. 2.

FIG. 1 is a perspective view of an embodiment of a display device according to the invention. FIG. 2 is a view illustrating a display module accommodated in the case shown in FIG. 1. FIG. 3 is a view illustrating a rolling state of the display module shown in FIG. 2.

Referring to FIGS. 1 and 2, the display device DD may include a case CS, a display module DM, a first coupling part CP1, and a second coupling part CP2. An opening OP opened in the first direction DR1 may be defined in the case CS. The case CS may extend longer in a second direction DR2 crossing the first direction DR1 than the first direction DR1.

Hereinafter, a direction crossing a plane defined by the first and second directions DR1 and DR2 is defined as a third direction DR3. The case CS may extend longer in the third direction DR3 than in the first direction DR1. The case CS may extend longer in the second direction DR2 than in the third direction DR3.

The first coupling part CP1 may be disposed on the case CS adjacent to the opening OP. The first coupling part CP1 may move toward or away from the case CS in the first direction DR1. The second coupling part CP2 may be adjacent to the opening OP and may be connected to the first coupling part CP1. The second coupling part CP2 may move together with the first coupling part CP1 to move away from or closer to the case CS in the first direction DR1.

The display module DM may be accommodated in the case CS. In an embodiment, the display module DM may have a quadrangular (e.g., rectangular) shape having long sides extending in the first direction DR1 and short sides extending in the second direction DR2. However, the invention is not limited thereto, and the display module DM may have various shapes, such as a circular shape or a polygonal shape.

The upper surface of the display module DM may be defined as the display surface DS and may have a plane defined by the first direction DR1 and the second direction DR2. The images IM generated by the display module DM may be provided to the user through the display surface DS.

The display surface DS may include a display area DA and a non-display area NDA around the display area DA. The display area DA may display an image, and the non-display area NDA may not display an image. The non-display area NDA may surround the display area DA and may define an outline portion of the display module DM printed in a predetermined color.

Referring to FIG. 3, the display module DM may be a flexible display module. The display module DM may be rolled up like a scroll. The display module DM may be rolled up from one side of the display module DM. In an embodiment, the display module DM may be rolled so that the display surface DS faces outward, but is not limited thereto, and the display module DM may be rolled so that the display surface DS faces inward.

Referring to FIG. 1, the display device DD may be used in large electronic devices such as a TV, a monitor, or an external billboard. In embodiments, the display device DD may be used in small and medium-sized electronic devices such as a personal computer, a notebook computer, a personal digital terminal, a game console, a smart phone, a tablet, or a camera. The display device DD may be used as a navigation device for a car, an aircraft, or a ship. However, these are presented only as some of embodiments, and may be used in other electronic devices without departing from the concept of the invention.

Figure 4:
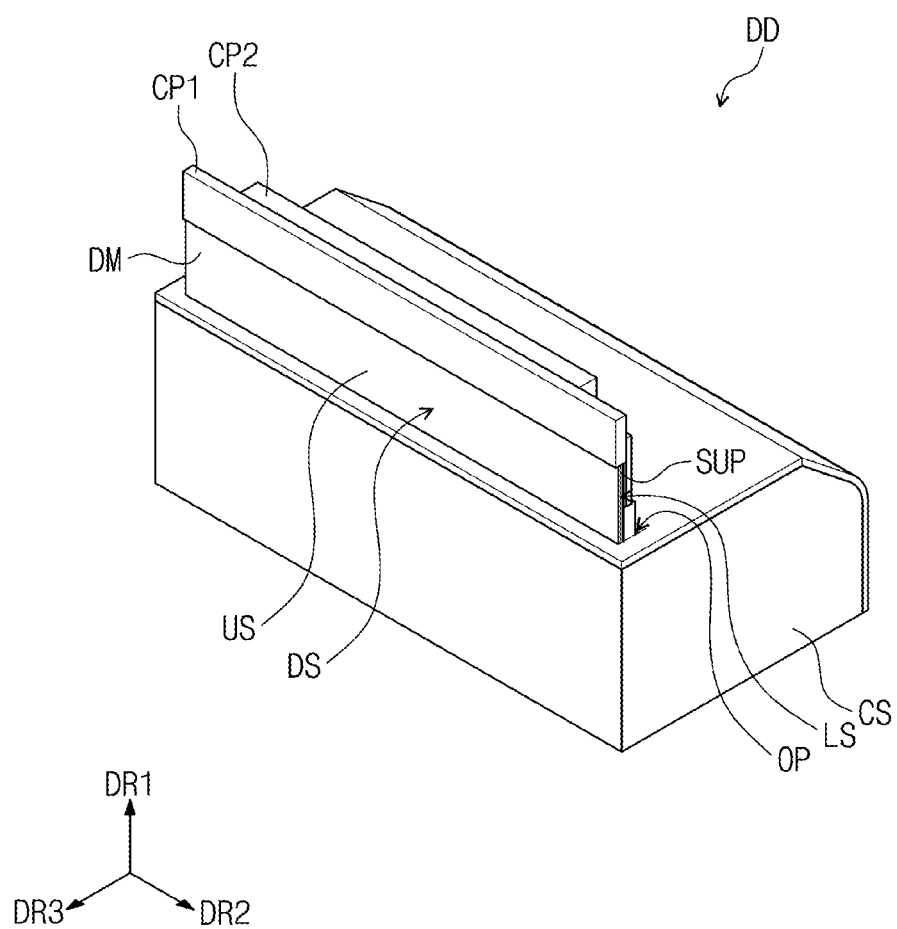
FIGS. 4 and 5 are views illustrating a display module exposed to the outside in the case shown in FIG. 1.
Figure 5:
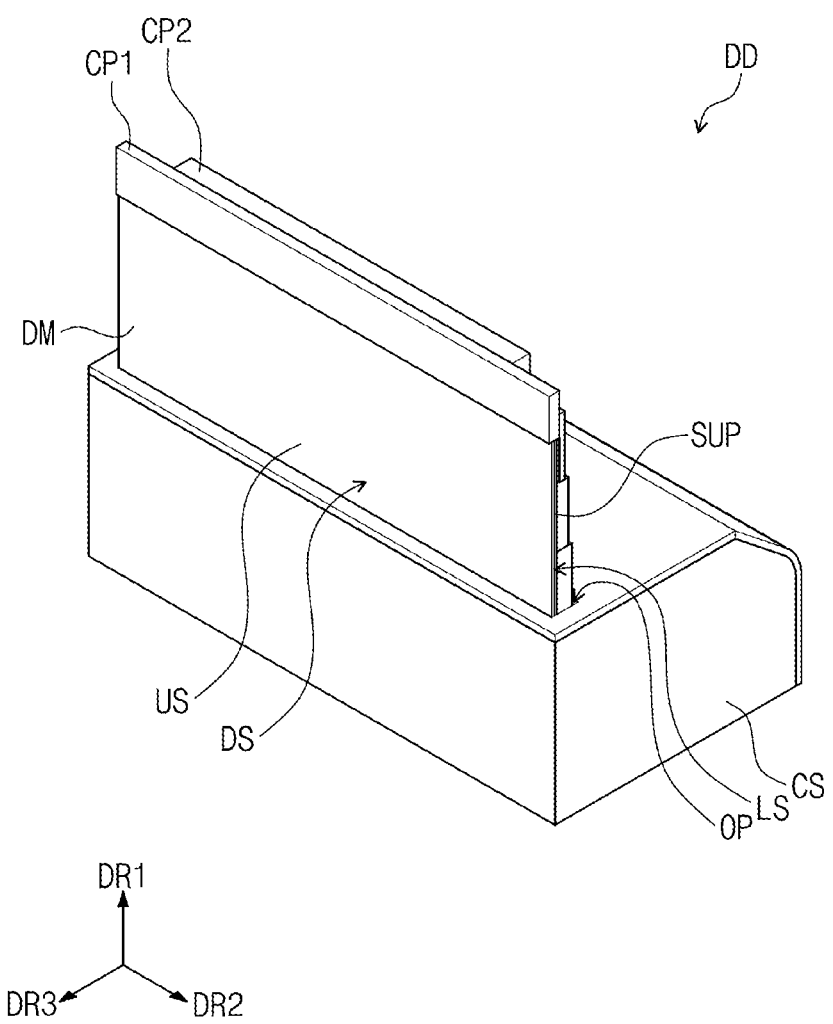

FIGS. 4 and 5 are views illustrating a display module exposed to the outside in the case illustrated in FIG. 1.

Referring to FIGS. 4 and 5, the display device DD may include a support part SUP for supporting the display module DM. The display surface DS may be defined as the upper surface US of the display module DM, and one surface of the display module DM opposite to the display surface DS may be defined as the lower surface LS of the display module DM. Hereinafter, based on the third direction DR3, a left surface of a predetermined configuration is represented as an upper surface, and a right surface of a predetermined configuration is represented as a lower surface.

The support part SUP may be disposed on the lower surface LS of the display module DM to support the display module DM. The support part SUP and the display module DM may be connected to the first coupling part CP1. The support part SUP and the display module DM may move in the first direction DR1 along the first coupling part CP1. The support part SUP and the display module DM may be drawn out of the case CS through the opening OP, or may be introduced into the case CS. The area of the exposed surface of the display module DM may be adjusted in various ways.

The second coupling part CP2 may be connected to a lower surface of the first coupling part CP1. The second coupling part CP2 may be connected to a moving part for extending the display module DM to the outside of the case CS, and such a configuration will be described in detail below.

Figure 6:
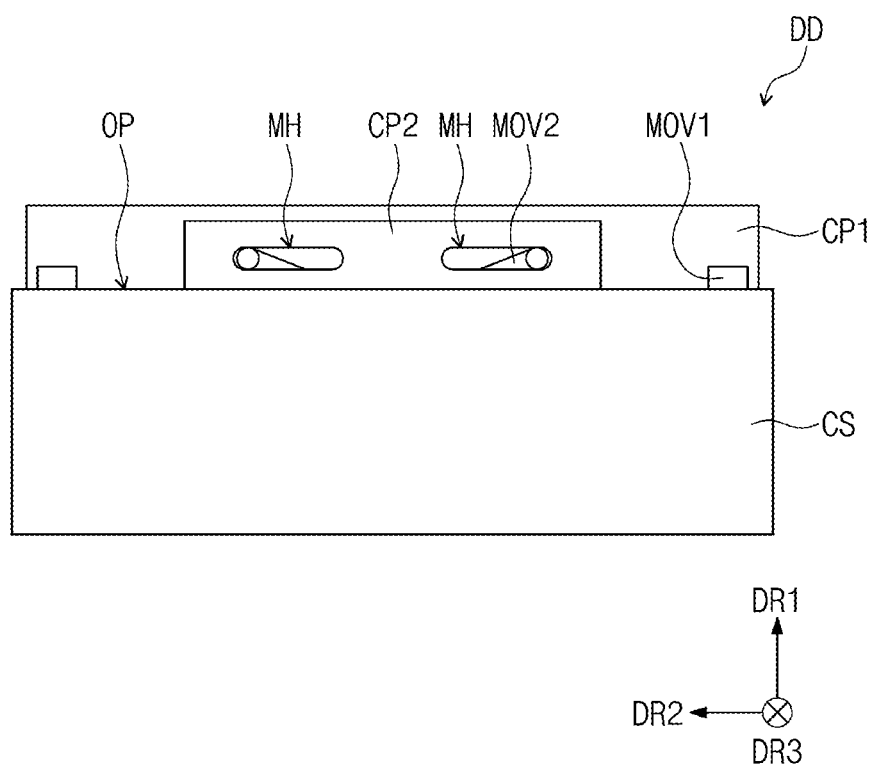
FIG. 6 is a rear view of the display device as viewed from the lower surface of the display module shown in FIG. 1.
Figure 7:
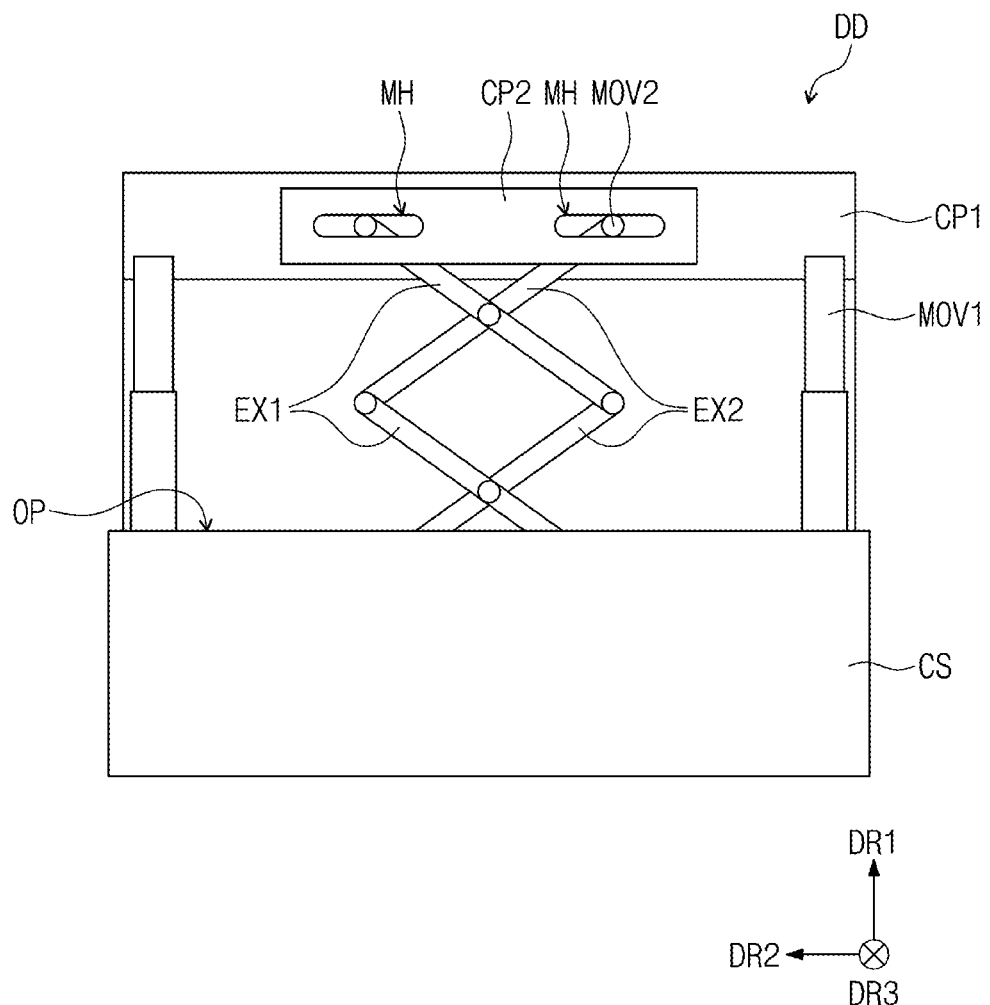
FIG. 7 is a rear view of the display device as viewed from the lower surface of the display module shown in FIG. 4.
Figure 8:
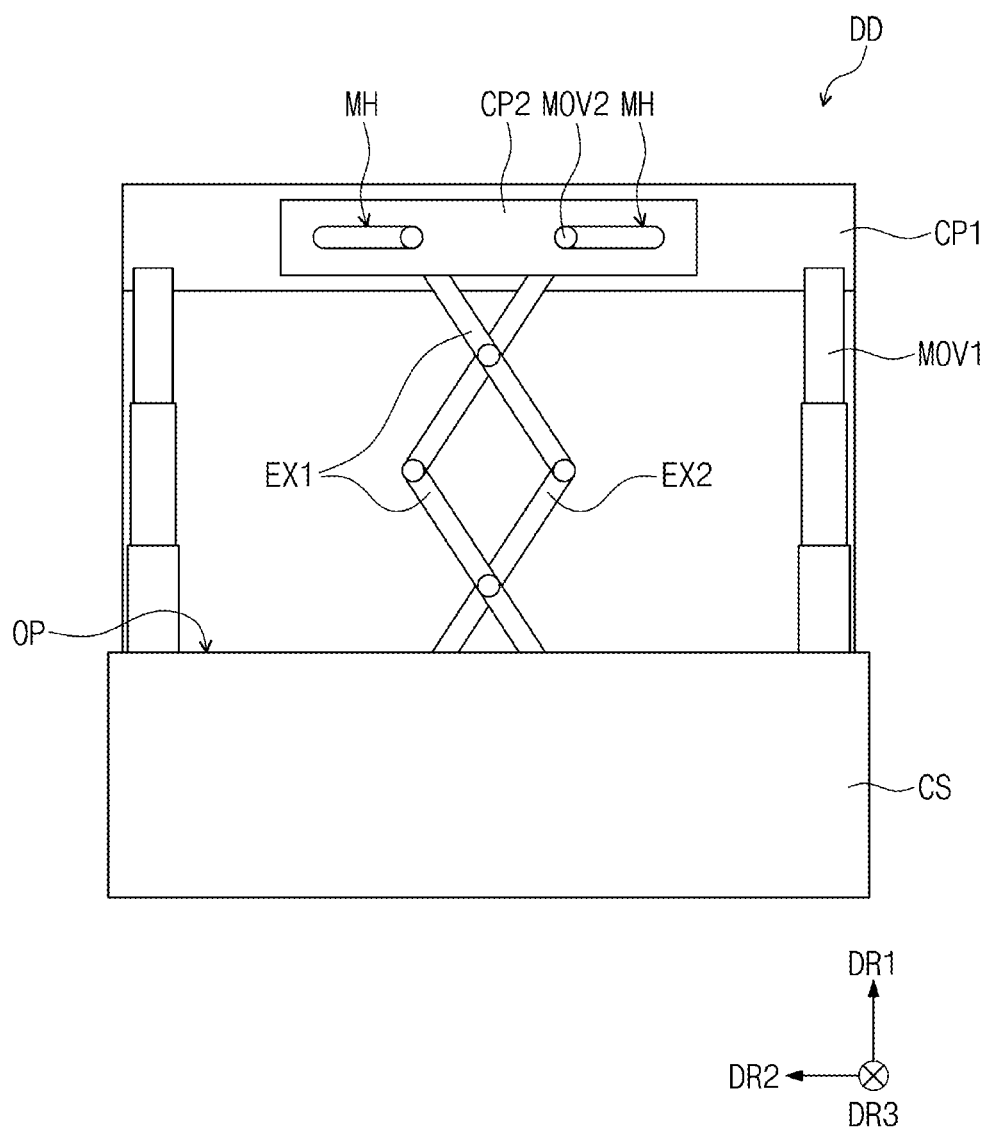
FIG. 8 is a rear view of the display device as viewed from the lower surface of the display module shown in FIG. 5.

FIG. 6 is a rear view of the display device as viewed from the lower surface of the display module shown in FIG. 1. FIG. 7 is a rear view of the display device as viewed from the lower surface of the display module shown in FIG. 4. FIG. 8 is a rear view of the display device as viewed from the lower surface of the display module shown in FIG. 5.

Referring to FIGS. 6, 7, and 8, the display device DD may include the display module DM and a plurality of moving parts MOV1 and MOV2 for extending the display module DM and the support part SUP to the outside of the case CS. The moving parts MOV1 and MOV2 are coupled in the case CS and may expand or contract in the first direction DR1.

The moving parts MOV1 and MOV2 may include a plurality of first moving parts MOV1 coupled in the case CS and a second moving part MOV2 coupled in the case CS. The first moving parts MOV1 may be spaced apart from each other in the second direction DR2, and the second moving part MOV2 may be disposed between the first moving parts MOV1.

The first moving parts MOV1 and the second moving part MOV2 may be disposed on a lower surface of the first coupling part CP1. One ends of the first moving parts MOV1 may be connected to the first coupling part CP1. The first moving parts MOV1 may have an antenna-like structure. Accordingly, the first moving parts MOV1 may expand or contract in the first direction DR1.

One end of the second moving part MOV2 may be connected to the second coupling part CP2. The second moving part MOV2 has a foldable bellow structure and may be expanded or contracted in the first direction DR1. In an embodiment, the second moving part MOV2 may include a plurality of first extension parts EX1 and a plurality of second extension parts EX2, for example.

The pair of first extension part EX1 and second extension part EX2 may be disposed to cross each other at a center part of the first extension part EX1 and a center part of the second extension part EX2. In an embodiment, a pair of the first extension part EX1 and the second extension part EX2 may be arranged in an "X" shape, for example. At the intersection part of the first and second extension parts EX1 and EX2, the first extension part EX1 and the second extension part EX2 may be coupled to each other to rotate. Also, an end of the first extension part EX1 adjacent to each other and an end of the second extension part EX2 may be coupled to each other to rotate.

Moving holes MH extending in the second direction DR2 and spaced apart from each other in the second direction DR2 may be defined in the second coupling part CP2. An end of the first extension part EX1 and an end of the second extension part EX2 disposed at the uppermost end are respectively disposed in the moving holes MH to move toward or away from each other in the second direction DR2.

When the end of the first extension part EX1 and the end of the second extension part EX2 disposed at the uppermost end move away from each other in the second direction DR2, the second moving part MOV2 may be reduced in the first direction DR1. When the second moving part MOV2 is reduced, the first moving parts MOV1 may be reduced in the first direction DR1.

When the end of the first extension part EX1 and the end of the second extension part EX2 disposed at the uppermost end move closer to each other in the second direction DR2, the second moving part MOV2 may be extend in the first direction DR1. When the second moving part MOV2 is expanded, the first moving parts MOV1 may be expanded in the first direction DR1.

As shown in FIG. 6, when the first and second moving parts MOV1 and MOV2 are reduced in the first direction DR1, the display module DM and the support part SUP may be accommodated in the case CS. Also, the first and second coupling parts CP1 and CP2 may be adjacent to the opening OP.

As shown in FIGS. 7 and 8, when the first and second moving parts MOV1 and MOV2 extend in the first direction DR1, according to the expansion of the first and second moving parts MOV1 and MOV2, the first and second coupling parts CP1 and CP2 may move in the first direction DR1 to move away from the case CS. Accordingly, the display module DM and the support part SUP connected to the first coupling part CP1 may be extended to the outside of the case CS through the opening OP.

Figure 9:
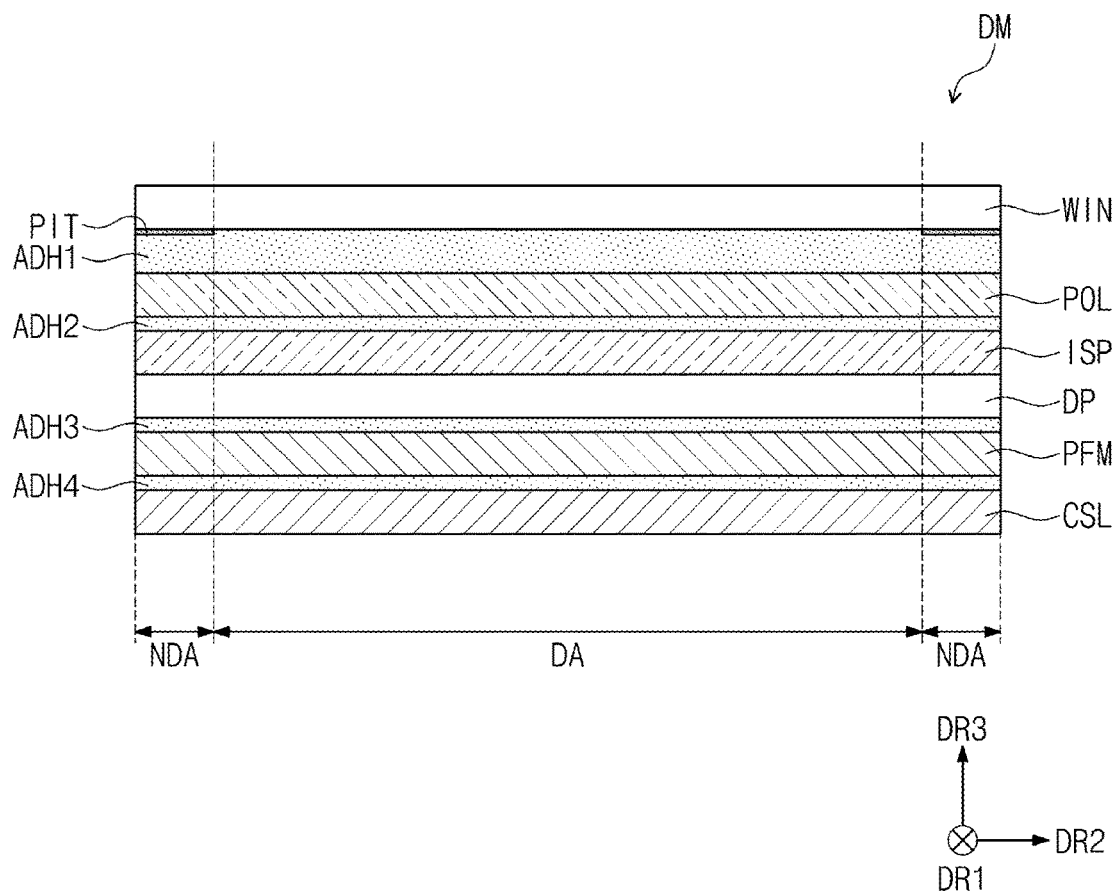
FIG. 9 is a diagram illustrating a cross-section of an embodiment of the display module shown in FIG. 2.

FIG. 9 is a diagram illustrating a cross-section of the display module shown in FIG. 2.

Referring to FIG. 9, the display module DM may include a display panel DP, an input detection unit ISP, a polarizing film POL, a window WIN, a printed layer PIT, a protective film PFM, a cushion layer CSL, and first to fourth adhesives ADH1 to ADH4.

The display panel DP may include a display area DA and a non-display area NDA around the display area DA. The display panel DP may be a flexible display panel. In an embodiment, the display panel DP may include a plurality of electronic elements disposed on the flexible substrate, for example.

The display panel DP in an embodiment of the invention may be a light-emitting display panel, but is not particularly limited. In an embodiment, the display panel DP may be an organic light-emitting display panel or a quantum dot light-emitting display panel, for example. In the organic light-emitting display panel, the light-emitting layer may include an organic light-emitting material. In an embodiment, the light-emitting layer of the quantum dot light-emitting display panel may include quantum dot, quantum rod, or the like. Hereinafter, the display panel DP is described as the organic light-emitting display panel.

The input detection unit ISP may be disposed on the display panel DP. The input detection unit ISP may include a plurality of sensor units (not shown) for detecting an external input. The sensor units may sense an external input in a capacitive manner. In an embodiment, the input detection unit ISP may be directly manufactured on the display panel DP when the display panel DP is manufactured. However, the invention is not limited thereto, and the input detection unit ISP may be manufactured as a panel separated from the display panel DP and then, attached to the display panel DP by an adhesive.

The polarizing film POL may be disposed on the input detection unit ISP. The polarizing film POL may be defined as an external light antireflection film. The polarizing film POL may reduce reflectance of external light incident toward the display panel DP from above the display module DM. In an embodiment, the polarizing film POL may include a phase retarder and/or a polarizer, for example.

The window WIN may be disposed on the polarizing film POL. The window WIN may protect the display panel DP, the input detection unit ISP, and the polarizing film POL from external scratches and impacts. The image generated by the display panel DP may pass through the window WIN to be provided to the user.

The protective film PFM may be disposed under the display panel DP. A protective film PFM may be defined as a protective substrate. The protective film PFM may protect the lower portion of the display panel DP. The protective film PFM may include a flexible plastic material. In an embodiment, the protective film PFM may include polyethylene terephthalate ("PET"), for example.

The cushion layer CSL may be disposed under the protective film PFM. The cushion layer CSL may absorb an external shock applied to the lower portion of the display module DM to protect the display panel DP. The cushion layer CSL may include a foam sheet having a predetermined elastic force.

The printed layer PIT may overlap the non-display area NDA and may be disposed on the lower surface of the window WIN facing the polarizing film POL. The printed layer PIT may not be arranged in the display area DA. The printed layer PIT may have a predetermined color, for example, may have a black color. The non-display area NDA may be printed in a predetermined color by the printed layer PIT.

The first adhesive ADH1 may be disposed between the window WIN and the polarizing film POL. The window WIN and the polarizing film POL may be bonded to each other by the first adhesive ADH1. The second adhesive ADH2 may be disposed between the polarizing film POL and the input detection unit ISP. The polarizing film POL and the input detection unit ISP may be bonded to each other by the second adhesive ADH2.

The third adhesive ADH3 may be disposed between the display panel DP and the protective film PFM. The display panel DP and the protective film PFM may be bonded to each other by the third adhesive ADH3. The fourth adhesive ADH4 may be disposed between the protective film PFM and the cushion layer CSL. The protective film PFM and the cushion layer CSL may be bonded to each other by the fourth adhesive ADH4.

The first adhesive ADH1 may include an optical clear adhesive. Each of the second, third, and fourth adhesives ADH2, ADH3, and ADH4 may include a pressure sensitive adhesive. Based on the third direction DR3, a thickness of the first adhesive ADH1 may be greater than a thickness of each of the second, third, and fourth adhesives ADH2, ADH3, and ADH4.

Figure 10:
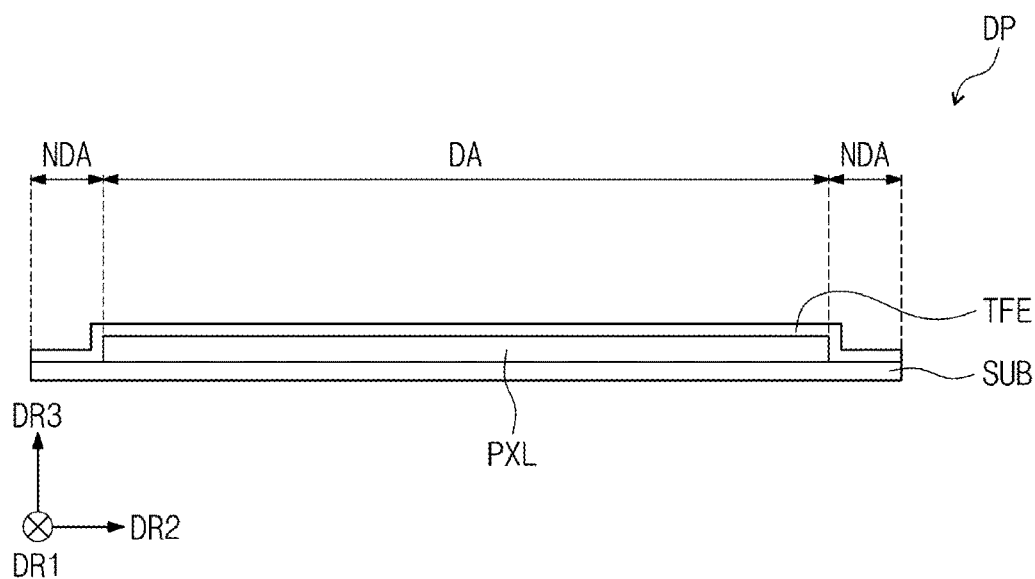
FIG. 10 is a diagram illustrating a cross-section of an embodiment of the display panel shown in FIG. 9.

FIG. 10 is a diagram illustrating a cross-section of the display panel shown in FIG. 9 by way of example.

Referring to FIG. 10, the display panel DP may include a substrate SUB, a pixel layer PXL disposed on the substrate SUB, and a thin film sealing layer TFE disposed on the substrate SUB to cover the pixel layer PXL.

The substrate SUB may include a display area DA and a non-display area NDA around the display area DA. The substrate SUB may include a flexible plastic material. In an embodiment, the substrate SUB may include polyimide ("PI"), for example. The pixel layer PXL may include a plurality of pixels. The configuration of the pixels will be described in detail below.

The thin film sealing layer TFE may include at least two inorganic layers and an organic layer disposed between the inorganic layers. The inorganic layers may include an inorganic material and may protect the pixel layer PXL from moisture/oxygen. The organic layer may include an organic material and may protect the pixel layer PXL from foreign substances such as dust particles. The input detection unit ISP may be disposed on the thin film sealing layer TFE.

Figure 11:
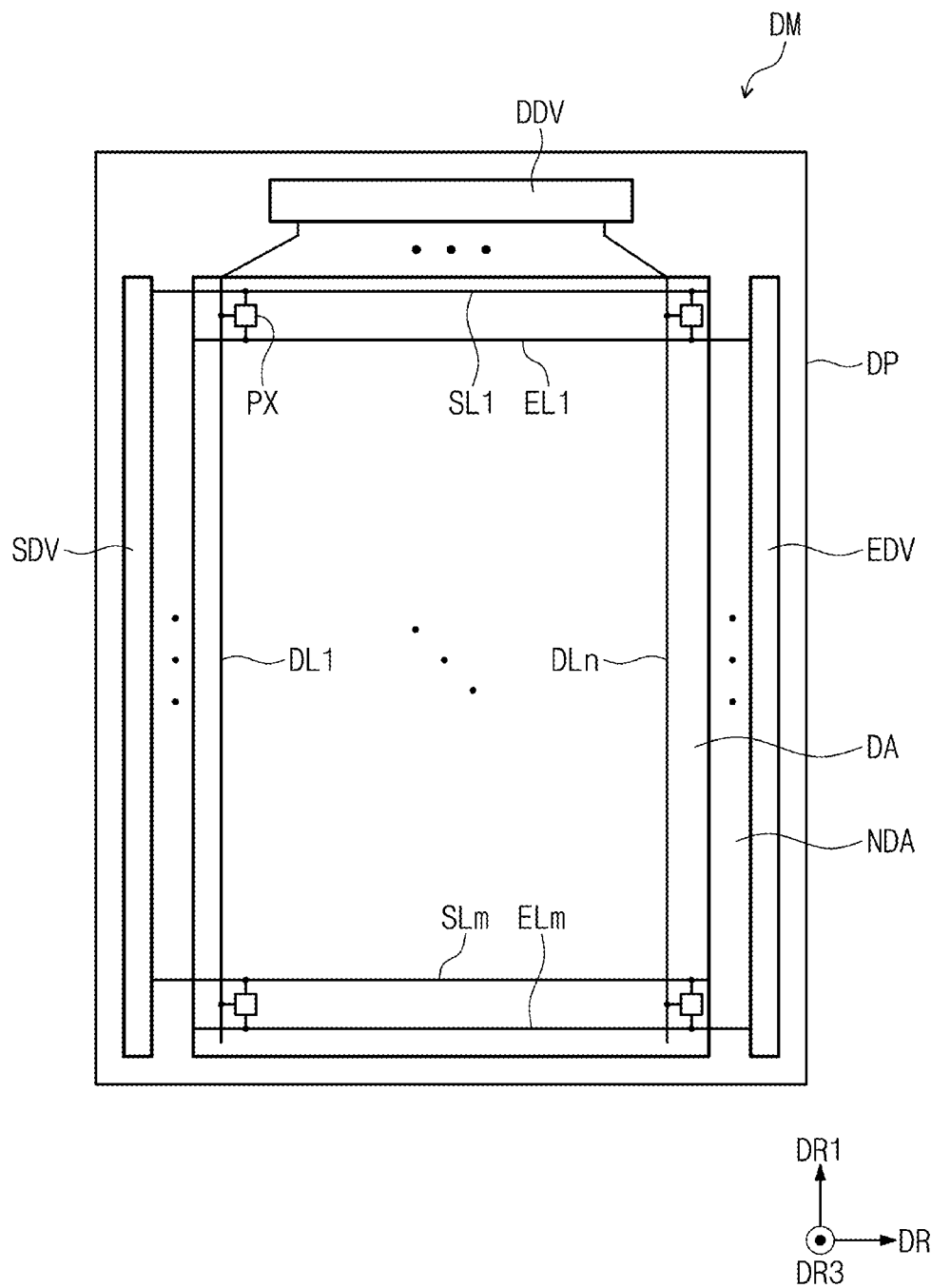
FIG. 11 is a plan view of the display panel shown in FIG. 9.

FIG. 11 is a plan view of an embodiment of the display panel illustrated in FIG. 9.

Referring to FIG. 11, a display device DD in an embodiment of the invention may include a display panel DP, a scan driver SDV, a data driver DDV, and an emission driver EDV. The scan driver SDV, the data driver DDV, and the emission driver EDV may be disposed on the display panel DP.

The display panel DP may have a quadrangular (e.g., rectangular) shape having long sides in the first direction DR1 and short sides in the second direction DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are natural numbers. In an embodiment, the pixels PX may be arranged in a matrix form, but is not limited thereto and may be arranged in various forms. The pixels PX are disposed in the display area DA and may be connected to the scan lines SL1 to SLm, the data lines DL1 to DLn, and the emission lines EL1 to ELm.

The scan driver SDV, the data driver DDV, and the emission driver EDV may be disposed in the non-display area NDA. The scan driver SDV and the emission driver EDV may be disposed adjacent to long sides of the display panel DP, respectively. The data driver DDV may be manufactured in the form of an integrated circuit chip and disposed adjacent to any one of the short sides of the display panel DP.

The scan lines SL1 to SLm may extend in the second direction DR2 and may be connected to the scan driver SDV. The data lines DL1 to DLn may extend in the first direction DR1 to be connected to the data driver DDV. The emission lines EL1 to ELm may extend in the second direction DR2 to be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

Although not shown in the drawing, the display device DD may include a timing controller (not shown) for controlling operations of the scan driver SDV, the data driver DDV, and the emission driver EDV.

The pixels PX may be provided with the data voltages in response to the scan signals. The pixels PX may display an image by emitting light having luminance corresponding to data voltages in response to emission signals. The emission time of the pixels PX may be controlled by emission signals.

Figure 12:
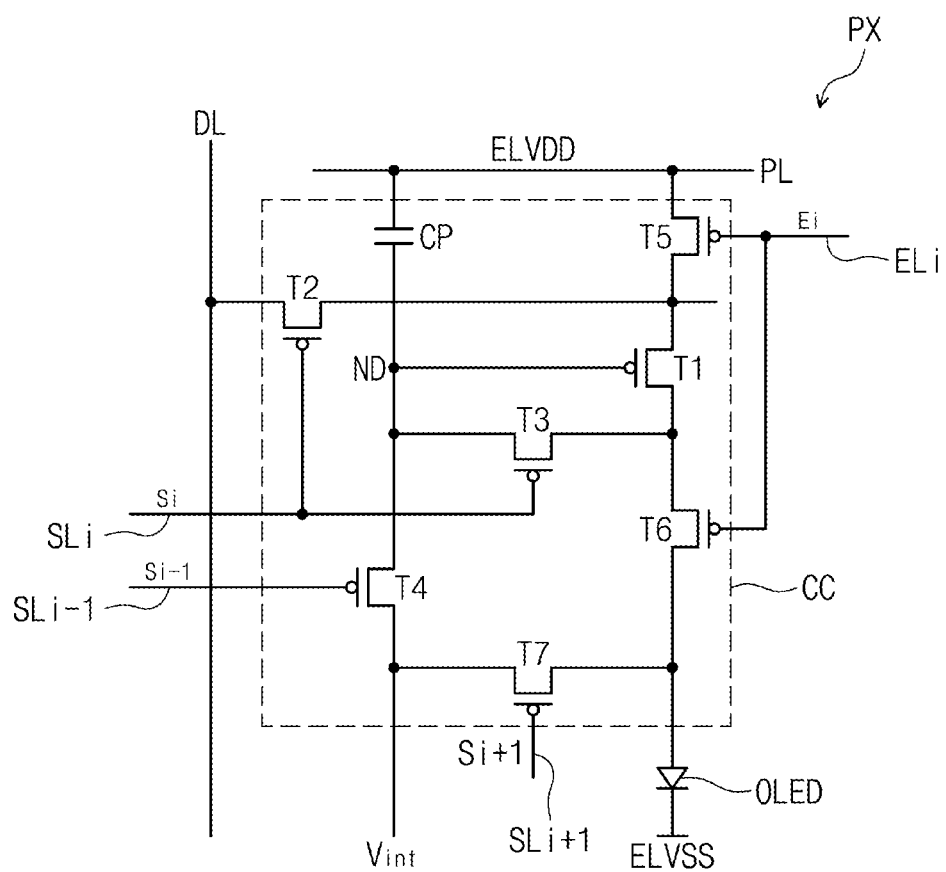
FIG. 12 is a diagram illustrating an embodiment of an equivalent circuit of any one pixel illustrated in FIG. 11.

FIG. 12 is a diagram illustrating an equivalent circuit of any one pixel illustrated in FIG. 11.

Referring to FIG. 12, the pixel PX may include a light-emitting element OLED and a pixel circuit CC. The pixel circuit CC may include a plurality of transistors T1 to T7 and a capacitor CP. The pixel circuit CC may control the amount of current flowing through the light-emitting element OLED in response to the data voltage. The light-emitting element OLED may emit light with a predetermined luminance corresponding to the amount of current provided from the pixel circuit CC.

Each of the transistors T1 to T7 may include an input electrode (or a source electrode), an output electrode (or a drain electrode), and a control electrode (or a gate electrode). In the specification, for convenience, one of the input electrode and the output electrode may be referred to as a first electrode, and the other may be referred to as a second electrode.

The first electrode of the first transistor T1 may be applied with the first voltage ELVDD through the fifth transistor T5, and the second electrode of the first transistor T1 may be connected to the anode electrode of the light-emitting element OLED through the sixth transistor T6. The first transistor T1 may be defined as a driving transistor. The first transistor T1 may control an amount of current flowing through the light-emitting element OLED according to a voltage applied to the control electrode of the first transistor T1.

The cathode of the light-emitting element OLED may receive a second voltage ELVSS having a lower level than that of the first voltage ELVDD.

The second transistor T2 may be connected between the data line DL and the first electrode of the first transistor T1, and the control electrode of the second transistor T2 may be connected to the i-th scan line SLi. Here, i may be a natural number equal to or less than m. The second transistor T2 may be turned on by receiving the i-th scan signal Si through the i-th scan line SLi to electrically connect the data line DL and the first electrode of the first transistor T1.

The third transistor T3 may be connected between the second electrode of the first transistor T1 and the control electrode of the first transistor T1. The control electrode of the third transistor T3 may be connected to the i-th scan line SLi. The third transistor T3 is turned on by receiving the i-th scan signal Si through the i-th scan line SLi to electrically connect the second electrode of the first transistor T1 and the control electrode of the first transistor T1. When the third transistor T3 is turned on, the first transistor T1 may be connected in a diode form.

The fourth transistor T4 may be connected between the node ND and an initialization power generation unit (not shown). The control electrode of the fourth transistor T4 may be connected to the (i−1)-th scan line SLi−1. The fourth transistor T4 may be turned on by receiving the (i−1)-th scan signal Si−1 through the (i−1)-th scan line SLi−1 to provide the initialization voltage Vint to the node ND.

The fifth transistor T5 may be connected between the power line PL and the first electrode of the first transistor T1. The control electrode of the fifth transistor T5 may be connected to the i-th emission line ELi.

The sixth transistor T6 may be connected between the second electrode of the first transistor T1 and the anode electrode of the light-emitting element OLED. The control electrode of the sixth transistor T6 may be connected to the i-th emission line ELi. An i-th emission signal Ei may be applied to i-th emission line ELi.

The seventh transistor T7 may be connected between an initialization power generation unit (not shown) and an anode electrode of the light-emitting element OLED. The control electrode of the seventh transistor T7 may be connected to the (i+1)-th scan line SLi+1. The seventh transistor T7 may be turned on by receiving the (i+1)-th scan signal Si+1 through the (i+1)-th scan line SLi+1 to provide the initialization voltage Vint to the anode electrode of the light-emitting element OLED.

The capacitor CP may be disposed between the power line PL and the node ND. The capacitor CP may store a data voltage. When the fifth transistor T5 and the sixth transistor T6 are turned on, the amount of current flowing through the first transistor T1 may be determined according to the voltage stored in the capacitor CP.

Although the transistors T1 to T7 in FIG. 12 are illustrated based on p-channel metal-oxide semiconductor ("PMOS"), the invention is not limited thereto, and in an embodiment of the invention, at least one of the transistors T1 to T7 may include n-channel metal-oxide semiconductor ("NMOS").

Figure 13:
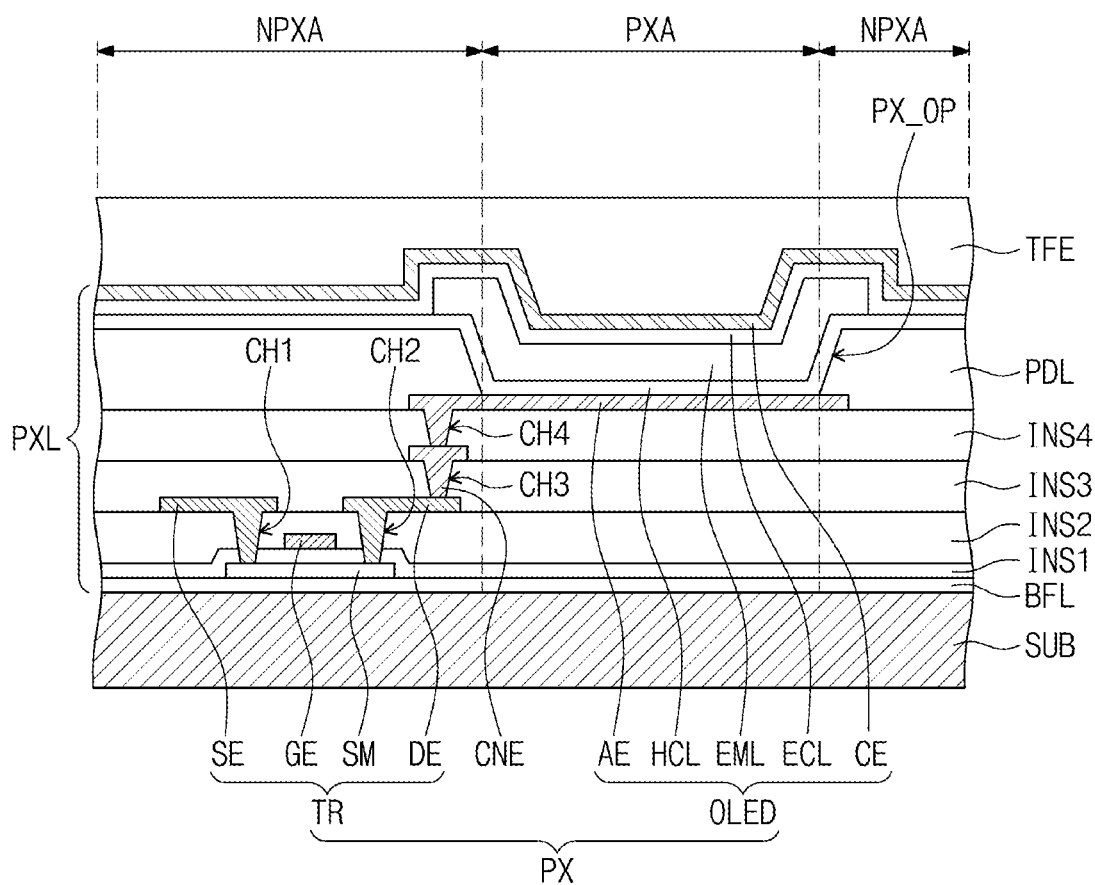
FIG. 13 is a view showing a cross-section of an embodiment of a portion corresponding to the light-emitting element shown in FIG. 12.

FIG. 13 is a view showing a cross-section of a portion corresponding to the light-emitting element shown in FIG. 12.

Referring to FIG. 13, the pixel PX may include a light-emitting element OLED and a transistor TR connected to the light-emitting element OLED. The light-emitting element OLED may include a first electrode AE, a second electrode CE, a hole control layer HCL, an electron control layer ECL, and an emission layer EML. The first electrode AE may be an anode electrode, and the second electrode CE may be a cathode electrode. The transistor TR may be the sixth transistor T6 illustrated in FIG. 12. The light-emitting element OLED may be defined as an organic light-emitting element.

The transistor TR and the light-emitting element OLED may be disposed on the substrate SUB. The substrate SUB may include an emission area PXA corresponding to each of the pixels PX and a non-emission area NPXA around the emission area PXA. The light-emitting element OLED may be disposed on the emission area PXA, and the transistor TR may be disposed on the non-emission area NPXA.

A buffer layer BFL is disposed on the substrate SUB, and the buffer layer BFL may include an inorganic material. A semiconductor layer SM of the transistor TR may be disposed on the buffer layer BFL. The semiconductor layer SM may include a semiconductor including an inorganic material such as amorphous silicon or polycrystalline silicon, or an organic semiconductor. Also, the semiconductor layer SM may include an oxide semiconductor. Although not shown in FIG. 13, the semiconductor layer SM may include a source region, a drain region, and a channel region between the source region and the drain region.

A first insulating layer INS1 may be disposed on the buffer layer BFL to cover the semiconductor layer SM. The first insulating layer INS1 may include an inorganic material. A gate electrode GE of the transistor TR overlapping the semiconductor layer SM may be disposed on the first insulating layer INS1. The gate electrode GE may be disposed to overlap a channel region of the semiconductor layer SM.

A second insulating layer INS2 may be disposed on the first insulating layer INS1 to cover the gate electrode GE. The second insulating layer INS2 may include an organic material and/or an inorganic material.

The source electrode SE and the drain electrode DE of the transistor TR may be disposed on the second insulating layer INS2 to be spaced apart from each other. The source electrode SE may be connected to the source region of the semiconductor layer SM through the first contact hole CH1 defined in the first insulating layer INS1 and the second insulating layer INS2. The drain electrode DE may be connected to the drain region of the semiconductor layer SM through the second contact hole CH2 defined in the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may include an organic material. A connection electrode CNE may be disposed on the third insulating layer INS3. The connection electrode CNE may be connected to the drain electrode DE through the third contact hole CH3 defined in the third insulating layer INS3.

A fourth insulating layer INS4 may be disposed on the third insulating layer INS3 to cover the connection electrode CNE. The first electrode AE may be disposed on the fourth insulating layer INS4. The first electrode AE may be connected to the connection electrode CNE through a fourth contact hole CH4 defined in the fourth insulating layer INS4.

A pixel defining layer PDL exposing a predetermined portion of the first electrode AE may be disposed on the first electrode AE and the fourth insulating layer INS4. An opening PX_OP for exposing a predetermined portion of the first electrode AE may be defined in the pixel defining layer PDL.

The hole control layer HCL may be disposed on the first electrode AE and the pixel defining layer PDL. The hole control layer HCL may be commonly disposed in the emission area PXA and the non-emission area NPXA. The hole control layer HCL may include a hole transport layer, and may further include a hole injection layer.

The light-emitting layer EML may be disposed on the hole control layer HCL. The light-emitting layer EML may be disposed in an area corresponding to the opening PX_OP. That is, the light-emitting layer EML may be separated from each other in the pixels PX. The light-emitting layer EML may include an organic material and/or an inorganic material. In an embodiment, the light-emitting layer EML may generate any one of red, green, and blue light. However, the invention is not limited thereto, and the light-emitting layer EML may generate white light by combining red, green, and blue organic materials.

The electron control layer ECL may be disposed on the light-emitting layer EML. The electron control layer ECL may be disposed on the hole control layer HCL to cover the light-emitting layer EML. That is, the electron control layer ECL may be commonly disposed in the emission area PXA and the non-emission area NPXA. The electron control layer ECL may include an electron transport layer and may further include an electron injection layer.

The second electrode CE may be disposed on the electron control layer ECL. The second electrode CE may be commonly disposed on the pixels PX. The thin film sealing layer TFE may be disposed on the second electrode CE. A layer between the substrate SUB and the thin film sealing layer TFE may be defined as a pixel layer PXL.

The first voltage ELVDD may be applied to the first electrode AE, and the second voltage ELVSS may be applied to the second electrode CE. The holes and electrons injected into the light-emitting layer EML are combined to form excitons, and as the excitons transition to the ground state, the light-emitting element OLED may emit light. The light-emitting element OLED may emit light to display an image.

Figure 14:
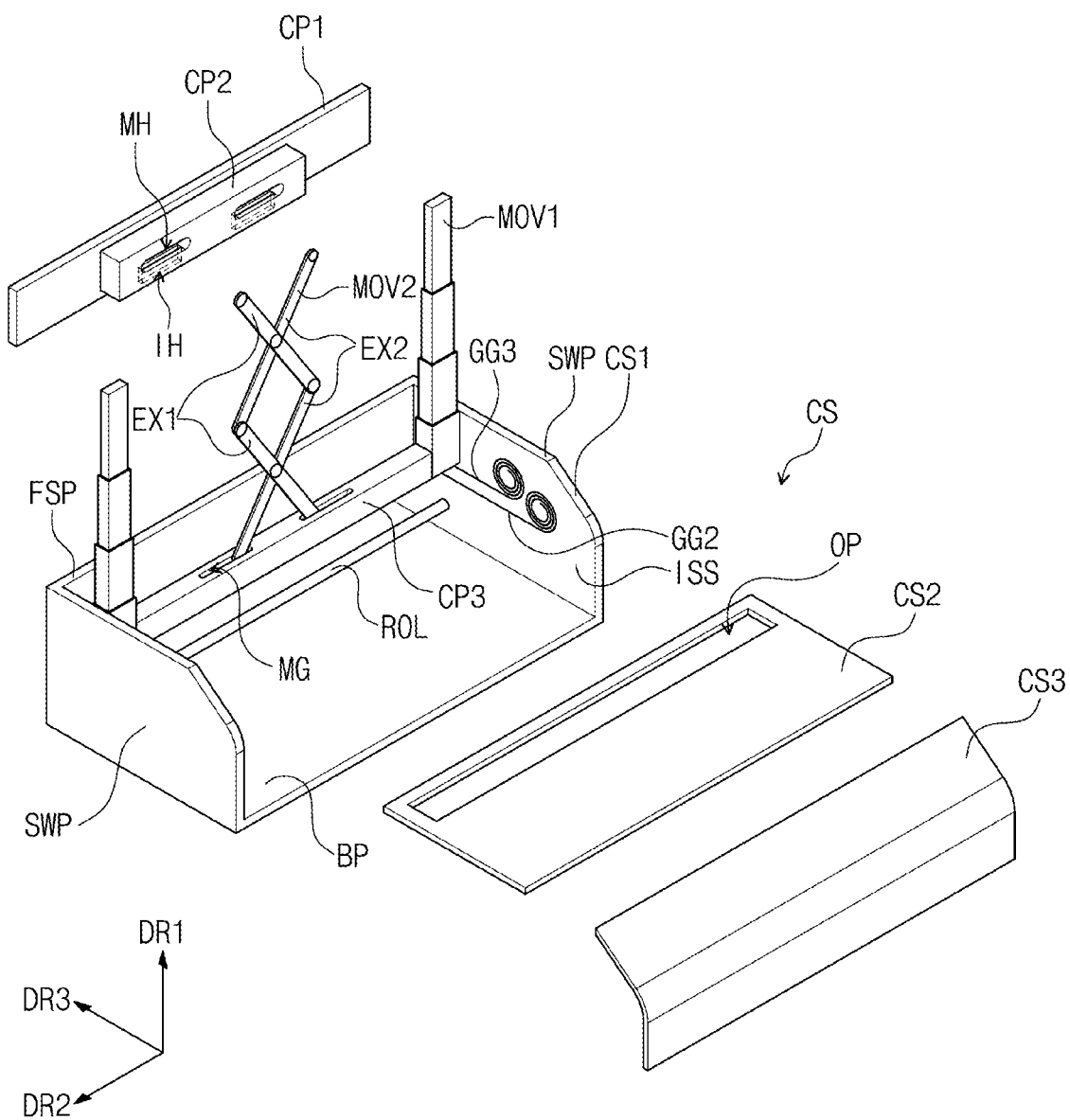
FIG. 14 is an exploded perspective view of the case shown in FIG. 1.
Figure 15:
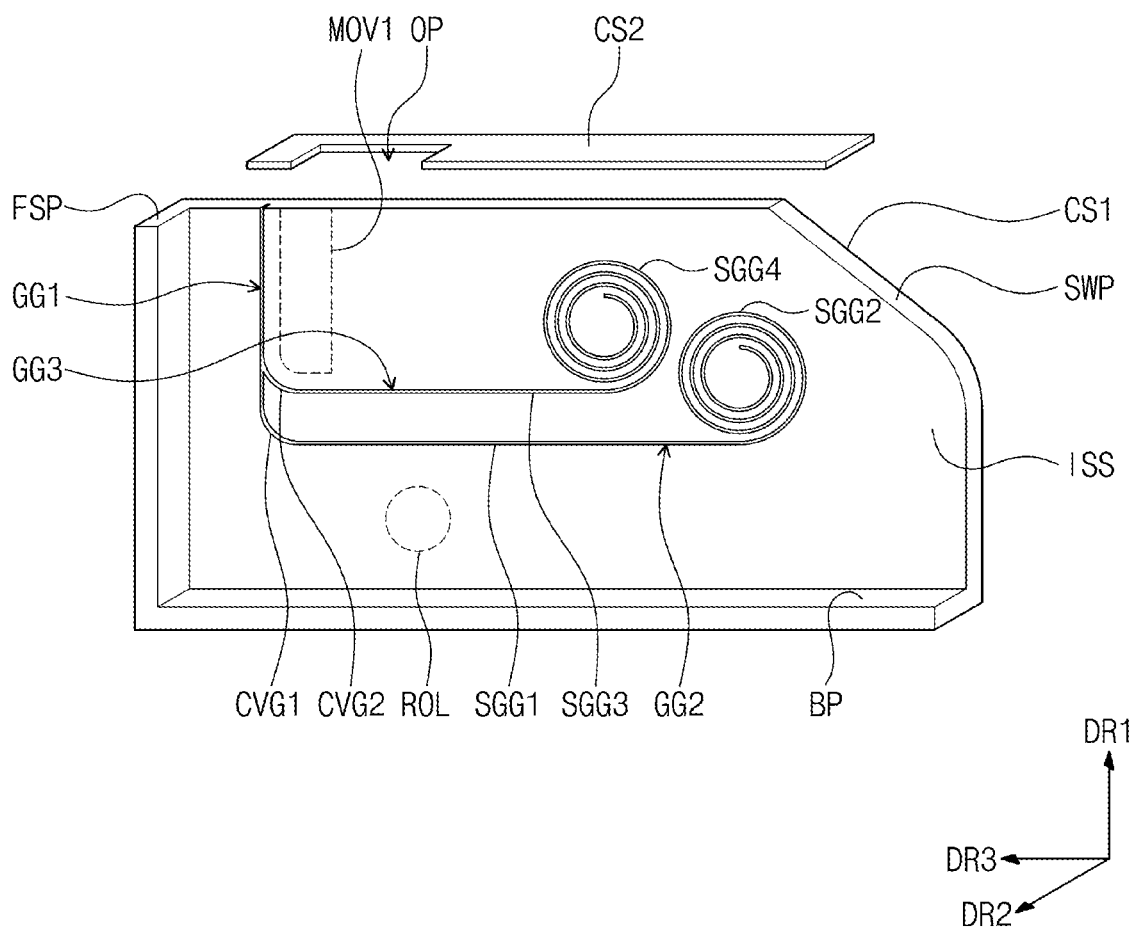
FIG. 15 is a view showing an inner surface of any one of the sidewall parts shown in FIG. 14.

FIG. 14 is an exploded perspective view of the case shown in FIG. 1. FIG. 15 is a view showing an inner surface of any one of the sidewalls shown in FIG. 14.

Referring to FIG. 14, the case CS may include a first case CS1, a second case CS2, and a third case CS3. The first case CS1 may include a bottom part BP, sidewall parts SWP extending in the first direction DR1 from opposite sides of the bottom part BP opposite to each other in the second direction DR2, and a front part FSP extending in the first direction DR1 from one of opposite sides of the bottom part BP opposite to each other in the third direction DR3.

The bottom part BP may have a plane defined by the second and third directions DR2 and DR3. The sidewall parts SWP may have a plane defined by the first and third directions DR1 and DR3. The front part FSP may have a plane defined by the first and second directions DR1 and DR2. The front part FSP may define the front surface of the case CS.

The second case CS2 may have a plane defined by the second and third directions DR2 and DR3. The second case CS2 may be disposed on the upper portion of the first case CS1 to cover the upper portion of the first case CS1. An opening OP may be defined in the second case CS2. The opening OP may extend in the second direction DR2.

The third case CS3 may be disposed at a rear of the first case CS1 opposite to the front part FSP of the first case CS1 to cover the rear of the first case CS1. The third case CS3 may have a convex curved surface. The third case CS3 may define a rear surface of the case CS. The front surface of the case CS may correspond to the upper surface US of the display module DM, and the rear surface of the case CS may correspond to the lower surface LS of the display module DM. The first, second, and third cases CS1, CS2, and CS3 may be coupled to each other to form the case CS.

The display device DD may include a roller ROL and a third coupling part CP3 disposed in the first case CS1. The roller ROL may have a cylindrical shape extending in the second direction DR2 and may be connected to the sidewall parts SWP. The roller ROL may be adjacent to the bottom part BP. The third coupling part CP3 may extend in the second direction DR2.

The first moving parts MOV1 and the second moving part MOV2 may be disposed in the first case CS1. The first moving parts MOV1 may be respectively connected to inner surfaces ISS of the sidewall parts SWP facing each other in the second direction DR2. The third coupling part CP3 may be disposed between the first moving parts MOV1 to be connected to lower portions of the first moving parts MOV1. The second moving part MOV2 may be connected to the third coupling part CP3.

Moving grooves MG extending in the second direction DR2 and spaced apart from each other in the second direction DR2 may be defined above the third coupling part CP3. An end of the first extension part EX1 disposed at the lowermost end and an end of the second extension part EX2 disposed at the lowermost end may be respectively disposed in the moving grooves MG to move in the second direction DR2. Although not shown in the drawing, a driving part for moving the end of the first extension part EX1 disposed at the lowermost end and the end of the second extension part EX2 disposed at the lowermost end in the second direction DR2 may be disposed in the third coupling part CP3.

When moving in the second direction DR2 so that the end of the first extension part EX1 disposed at the lowermost end and the end of the second extension part EX2 disposed at the lower end are close to each other, the second moving part MOV2 may extend in the first direction DR1. When moving in the second direction DR2 so that the end of the first extension part EX1 disposed at the lowermost end and the end of the second extension part EX2 disposed at the lower end are away from each other, the second moving part MOV2 may be reduced in the first direction DR1.

The end of the first extension part EX1 disposed at the uppermost end and the end of the second extension part EX2 disposed at the uppermost end may be disposed in the moving holes MH through the insertion holes IH defined under the second coupling part CP2.

Referring to FIGS. 14 and 15, a first guide groove GG1, a second guide groove GG2, and a third guide groove GG3 may be defined in the inner surfaces ISS of the sidewall parts SWP, respectively. The inner surfaces ISS of the sidewall parts SWP may define inner surfaces of the case CS facing each other in the second direction DR2. In FIG. 15, a portion of the inner surface ISS on which the roller ROL and the first moving part MOV1 are disposed is illustrated by a dotted line, for example.

The first guide groove GG1 may be adjacent to the front part FSP and may extend in the first direction DR1. When the second case CS2 is coupled to the first case CS1, the first guide groove GG1 may extend toward the opening OP.

The first guide groove GG1 may be disposed between the first moving part MOV1 and the front part FSP. A lower end of the first guide groove GG1 may be defined as one end of the first guide groove GG1 opposite to the opening OP.

The second guide groove GG2 may extend from one end of the first guide groove GG1. The third guide groove GG3 may extend from one end of the first guide groove GG1. The third guide groove GG3 may be spaced apart from the second guide groove GG2. The second and third guide grooves GG2 and GG3 may extend in the third direction DR3 to pass between the first moving part MOV1 and the roller ROL, and then have a rolled-up shape.

The second guide groove GG2 may include a first curved groove CVG1, a first sub guide groove SGG1, and a second sub guide groove SGG2. The first curved groove CVG1 may extend from one end of the first guide groove GG1 to have a curved shape. The first curved groove CVG1 may have a curved shape convex toward the case CS. In an embodiment, the first curved groove CVG1 may have a curved shape convex toward an edge between the front part FSP and the bottom part BP, for example.

The first sub guide groove SGG1 may extend from one end of the first curved groove CVG1. The first sub guide groove SGG1 may extend in the third direction DR3 to pass between the first moving part MOV1 and the roller ROL. The second sub guide groove SGG2 may extend from one end of the first sub guide groove SGG1 and have a rolled-up shape.

The third guide groove GG3 may include a second curved groove CVG2, a third sub guide groove SGG3, and a fourth sub guide groove SGG4. The second curved groove CVG2 may extend from one end of the first guide groove GG1 with a curved shape. The second curved groove CVG2 may have a curved shape convex toward the case CS. In an embodiment, the second curved groove CVG2 may have a curved shape convex toward an edge between the front part FSP and the bottom part BP, for example.

The third sub guide groove SGG3 may extend from one end of the second curved groove CVG2. The third sub guide groove SGG3 may extend in the third direction DR3 to pass between the first moving part MOV1 and the roller ROL. The third sub guide groove SGG3 may be disposed between the first moving part MOV1 and the first sub guide groove SGG1.

A length of the third sub guide groove SGG3 in the third direction DR3 may be less than a length of the first sub guide groove SGG1. The fourth sub guide groove SGG4 may extend from one end of the third sub guide groove SGG3 and have a rolled-up shape.

The fourth sub guide groove SGG4 may be spaced apart from the second sub guide groove SGG2 in the third direction DR3. The fourth sub guide groove SGG4 may be disposed between the first guide groove GG1 and the second sub guide groove SGG2.

Figure 16:
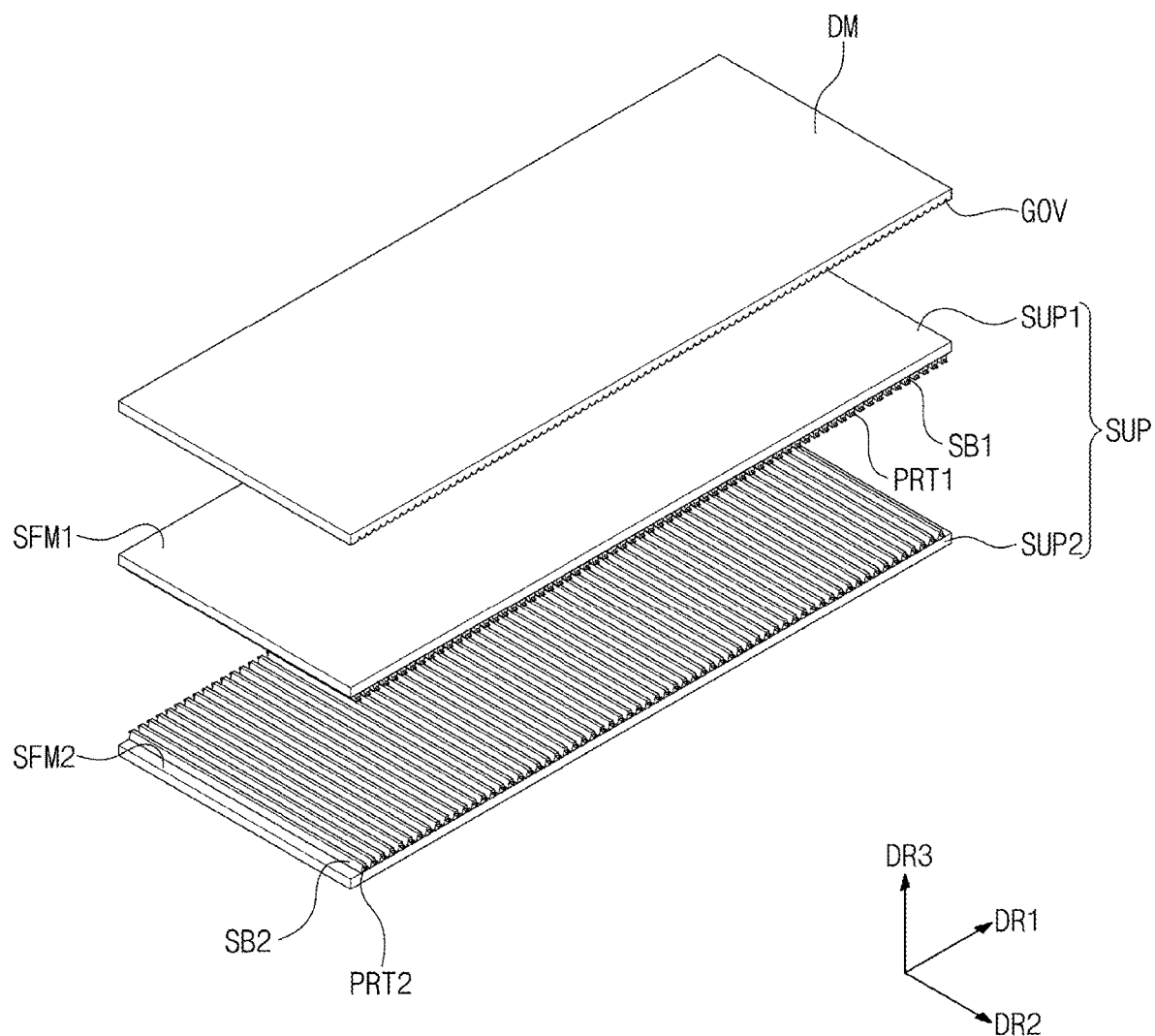
FIG. 16 is a perspective view of the display module and the support part shown in FIG. 4.
Figure 17:
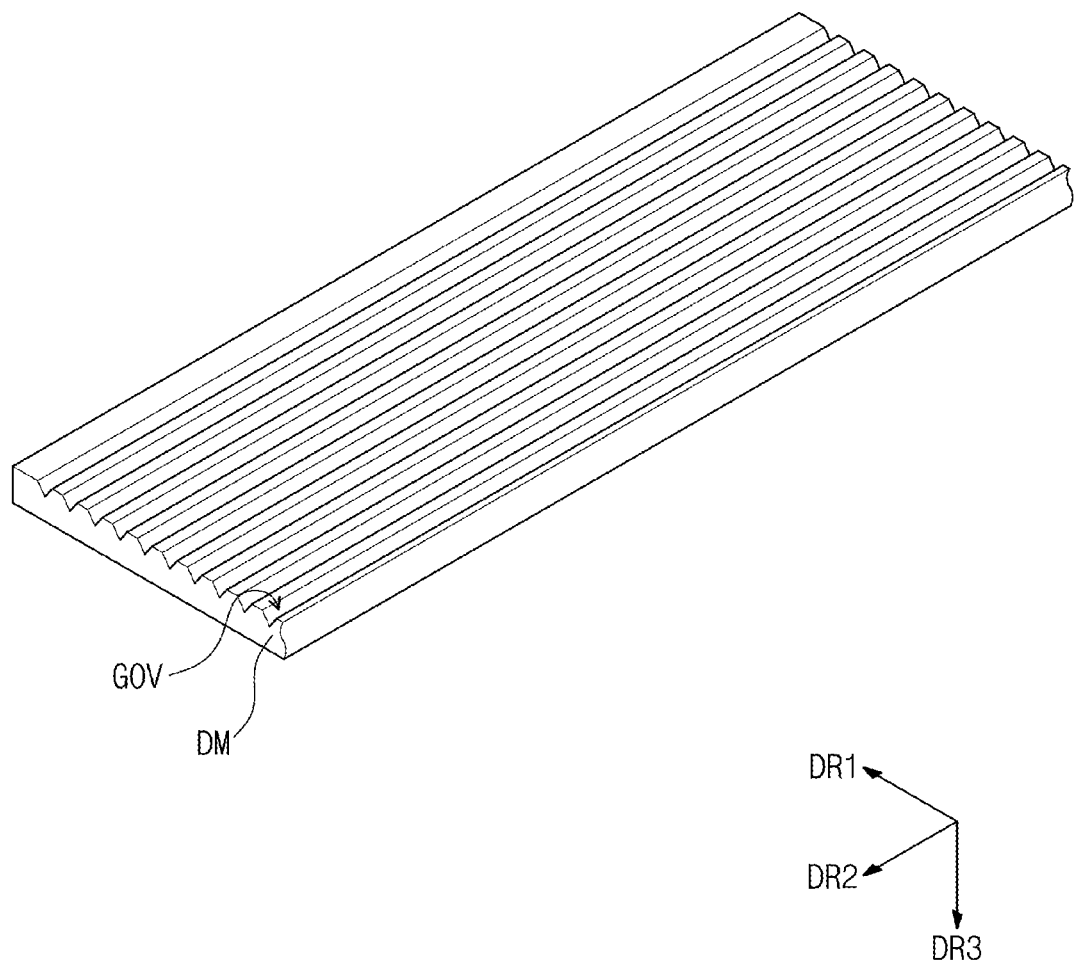
FIG. 17 is a view illustrating a lower surface of a part of the display module shown in FIG. 16.
Figure 18:
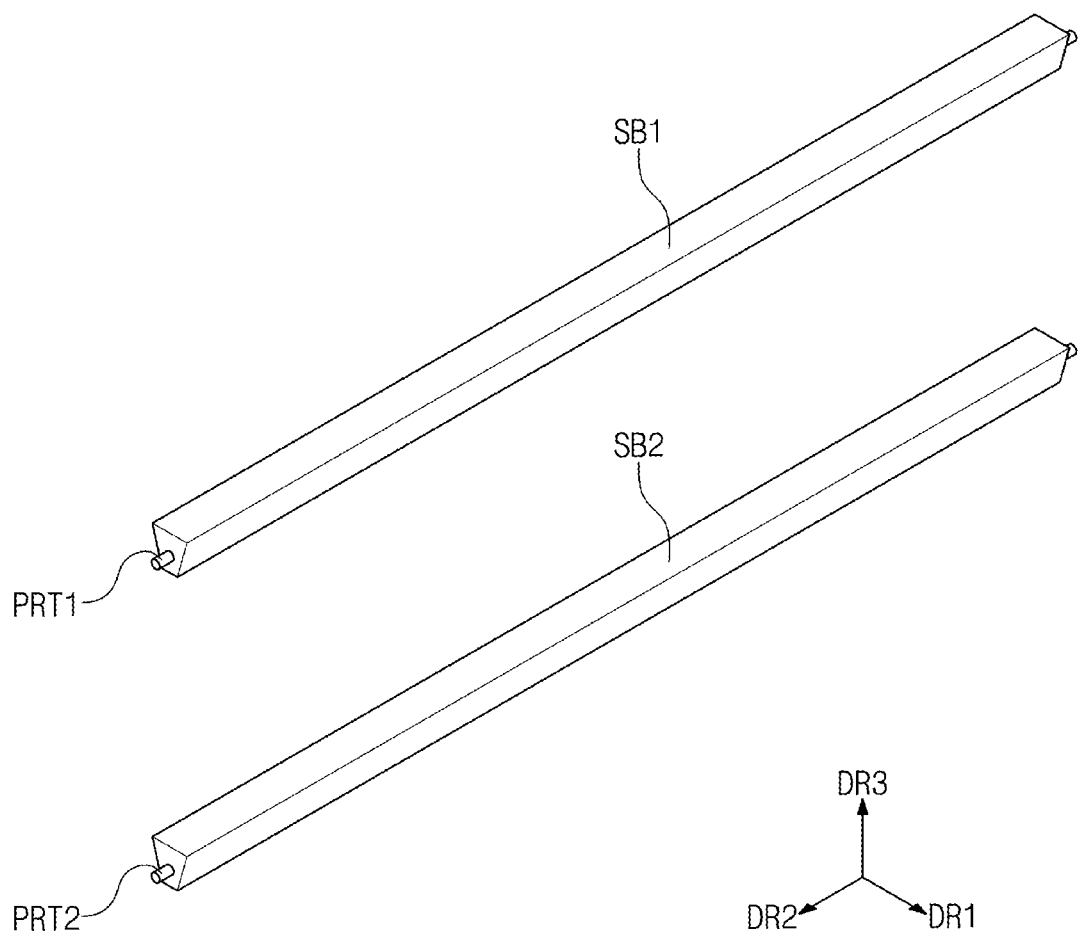
FIG. 18 is a perspective view of any one of the first support bar and any one of the second support bars shown in FIG. 16.

FIG. 16 is a perspective view of the display module and the support part shown in FIG. 4. FIG. 17 is a view illustrating a lower surface of a part of the display module shown in FIG. 16. FIG. 18 is a perspective view of any one of the first support bar and any one of the second support bars shown in FIG. 16.

In FIG. 16, the display module DM and the support part SUP are shown in a flat state.

Referring to FIG. 16, the support part SUP may have a quadrangular (e.g., rectangular) shape having long sides extending in a first direction DR1 and short sides extending in a second direction DR2. The support part SUP may be disposed below the display module DM. In an embodiment, a position corresponding to "under the display module DM" may be a position corresponding to "on the lower surface of the display module DM".

Referring to FIGS. 16 and 17, a plurality of grooves GOV extending in the second direction DR2 and arranged in the first direction DR1 may be defined in the lower surface of the display module DM. In an embodiment, in FIG. 17, when viewed from the second direction DR2, each of the grooves GOV has a "V" shape, for example, but the shape of the grooves GOV is not limited thereto.

In an embodiment, the grooves GOV may be defined in the cushion layer CSL illustrated in FIG. 9. However, the invention is not limited thereto, and the grooves GOV may be defined in the cushion layer CSL and the protective film PFM. When the grooves GOV are defined in the lower surface of the display module DM, the display module DM may be more easily bent.

Referring to FIG. 16, the support part SUP may include a first support part SUP1 disposed under the display module DM and a second support part SUP2 disposed under the first support part SUP1. The first and second support parts SUP1 and SUP2 may support the display module DM.

The first support part SUP1 may include a first support film SFM1 disposed under the display module DM, and a plurality of first support bars SB1 disposed under the first support film SFM1. The second support part SUP2 may include a second support film SFM2 disposed under the display module DM and a plurality of second support bars SB2 disposed under the second support film SFM2.

The first and second support films SFM1 and SFM2 may include a flexible plastic material. In an embodiment, the first and second support films SFM1 and SFM2 may include PI, for example. The first and second support bars SB1 and SB2 may include metal. In an embodiment, the first and second support bars SB1 and SB2 may include stainless steel (e.g., SUS 404), for example.

The first support bars SB1 may be disposed on a lower surface of the first support film SFM1 between the first support film SFM1 and the second support film SFM2. An upper surface of the first support film SFM1 may face the display module DM, and a lower surface of the first support film SFM1 may be defined as a surface opposite to an upper surface of the first support film SFM1. The first support bars SB1 may be attached to a lower surface of the first support film SFM1.

The second support bars SB2 may be disposed on an upper surface of the second support film SFM2 between the first support film SFM1 and the second support film SFM2. An upper surface of the second support film SFM2 may face a lower surface of the first support film SFM1. The second support bars SB2 may be attached to the upper surface of the second support film SFM2.

Referring to FIGS. 16 and 18, the first support bars SB1 may be arranged in the first direction DR1 and extend in the second direction DR2. The second support bars SB2 may be arranged in the first direction DR1 and may extend in the second direction DR2. When viewed from the second direction DR2, the first support bars SB1 may have a shape opposite to that of the second support bars SB2.

The first support bars SB1 may have an inverted trapezoidal shape when viewed from the second direction DR2. The second support bars SB2 may have a trapezoidal shape when viewed from the second direction DR2.

The first support part SUP1 may further include a plurality of first protrusion parts PRT1 protruding in the second direction DR2 from opposite sides of the first support bars SB1 opposite to each other in the second direction DR2. The second support part SUP2 may further include a plurality of second protrusion parts PRT2 protruding in the second direction DR2 from opposite sides of the second support bars SB2 opposite to each other in the second direction DR2.

Figure 19:
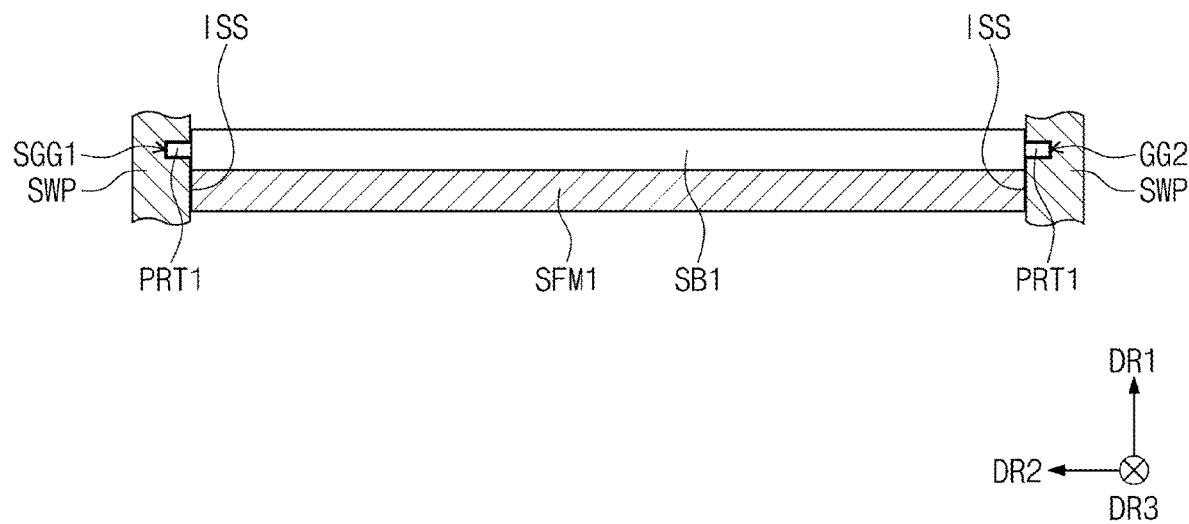
FIGS. 19 and 20 are views illustrating a structure in which the first and second protrusion parts shown in FIG. 16 are disposed on sidewall parts.
Figure 20:
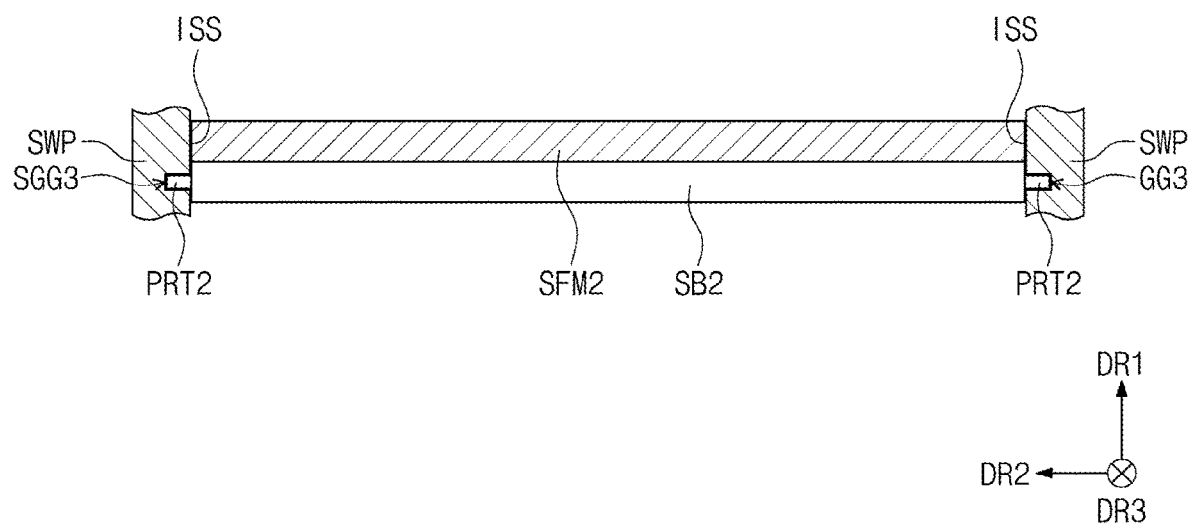

FIGS. 19 and 20 are views illustrating a structure in which the first and second protrusion parts shown in FIG. 16 are disposed on sidewall parts.

In an embodiment, when viewed from the third direction DR3, the first and second support bars SB1 and SB2 disposed in the first and third sub guide grooves SGG1 and SGG3 of the second and third guide grooves GG2 and GG3 are shown in FIGS. 19 and 20.

Referring to FIG. 19, opposite sides of the first support bars SB1 opposite to each other in the second direction DR2 may be disposed in the second guide grooves GG2. In an embodiment, the first protrusion parts PRT1 protruding from opposite sides of the first support bars SB1 may be disposed in the first sub guide grooves SGG1, for example. The first support film SFM1 may not be disposed in the second guide grooves GG2 but may be disposed between the sidewall parts SWP.

In an embodiment, the first protrusion parts PRT1 disposed in the first sub guide grooves SGG1 are shown, but the first protrusion parts PRT1 may also be disposed in the first curved groove CVG1 and the second sub guide groove SGG2 of each of the second guide grooves GG2. The first protrusion parts PRT1 may move along the second guide grooves GG2. As a result, the first support bars SB1 and the first support film SFM1 may move along the second guide grooves GG2.

Referring to FIG. 20, opposite sides of the second support bars SB2 opposite to each other in the second direction DR2 may be disposed in the third guide grooves GG3. In an embodiment, the second protrusion parts PRT2 protruding from opposite sides of the second support bars SB2 may be disposed in the third sub guide grooves SGG3, for example. The second support film SFM2 may not be disposed in the third guide grooves GG3 but may be disposed between the sidewall parts SWP.

In an embodiment, the second protrusion parts PRT2 disposed in the third sub guide grooves SGG3 are shown, but the second protrusion parts PRT2 may also be disposed in the second curved groove CVG2 and the fourth sub guide groove SGG4 of each of the third guide grooves GG3. The second protrusion parts PRT2 may move along the third guide grooves GG3. As a result, the second support bars SB2 and the second support film SFM2 may move along the third guide grooves GG3.

Figure 21:
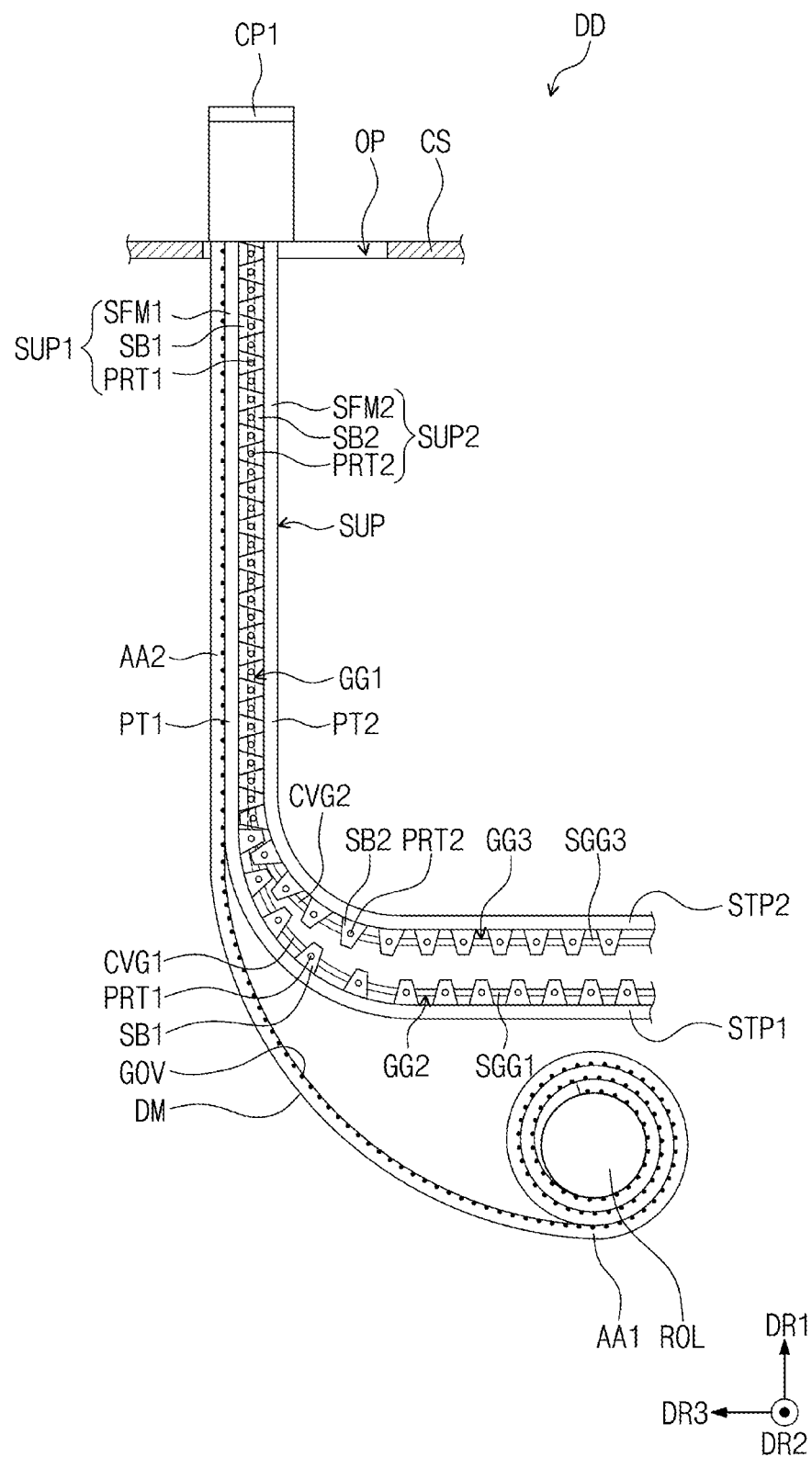
FIG. 21 is a view illustrating a structure in which the display module and the support part shown in FIG. 16 are disposed in a case.
Figure 22:
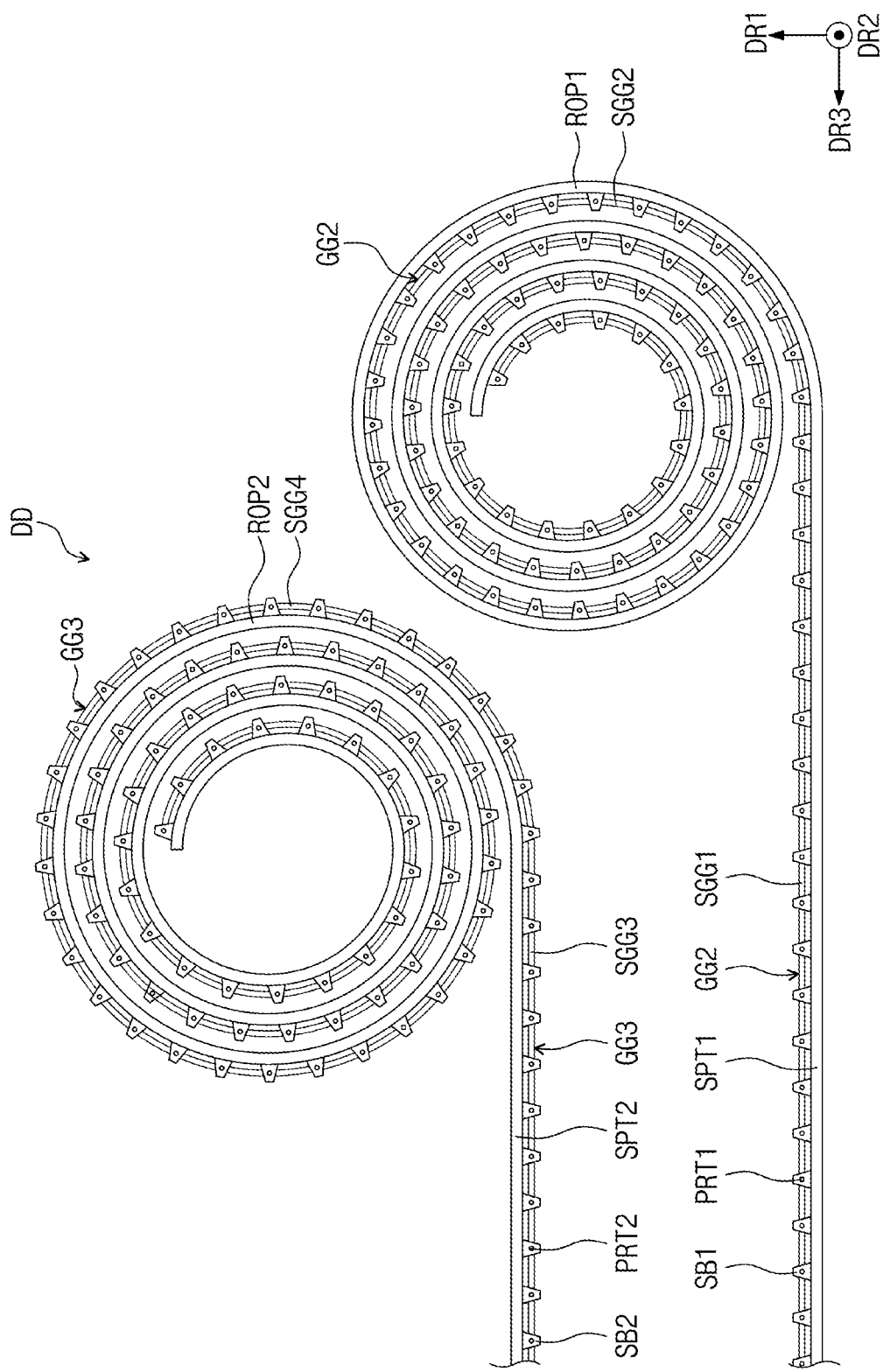
FIG. 22 is a view illustrating first and second support parts disposed in second and third guide grooves not shown in FIG. 21.
Figure 23:
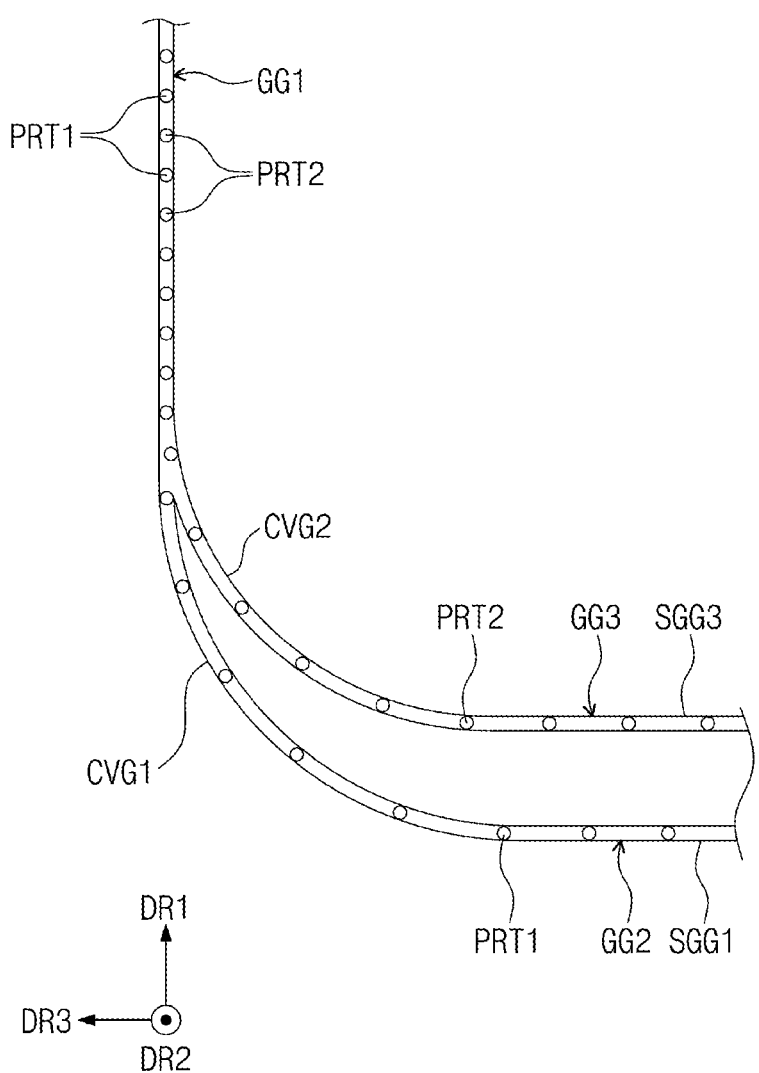
FIG. 23 is a view showing a structure in which the first and second protrusion parts shown in FIG. 21 are disposed in the first, second, and third guide grooves.

FIG. 21 is a view illustrating a structure in which the display module and the support part shown in FIG. 16 are disposed in a case. FIG. 22 is a view illustrating first and second support parts disposed in second and third guide grooves not shown in FIG. 21. FIG. 23 is a view showing a structure in which the first and second protrusion parts shown in FIG. 21 are disposed in the first, second, and third guide grooves.

FIGS. 19 and 20 will be described together as necessary for the following description. In an embodiment, in the case of the case CS in FIG. 21, a portion of the case CS adjacent to the opening OP is shown, for example. In addition, sides of the display module DM, the first, second, and third guide grooves GG1, GG2, and GG3, and the first and second support parts SUF1 and SUP2 viewed from the second direction DR2 are shown in FIGS. 21 and 22, and other components have been omitted.

Portions of the second and third guide grooves GG2 and GG3 are illustrated in FIG. 21, and the remaining portions of the second and third guide grooves GG2 and GG3 are illustrated in FIG. 22. In FIG. 21, the first guide groove GG1 is illustrated by a dotted line.

Illustratively, sides of the first and second protrusion parts PRT1 and PRT2 and the first, second, and third guide grooves GG1, GG2 and GG3 viewed from the second direction DR2 are shown in FIG. 23, and other components have been omitted. FIG. 23 shows parts of the first, second, and third guide grooves GG1, GG2, and GG3.

Referring to FIGS. 21 and 22, ends of the display module DM adjacent to the opening OP and ends of the first and second support films SFM1 and SFM2 adjacent to the opening OP may be connected to the first coupling part CP1. The display module DM, the first and second support films SFM1 and SFM2, and the first and second support bars SB1 and SB2 may be drawn out of the case CS or may be introduced into the case CS through the opening OP according to the movement of the first coupling part CP1.

The display module DM may be connected to the roller ROL and wound around the roller ROL. Since the groove GOV is defined in the lower surface LS of the display module DM, the display module DM may be more easily bent and wound around the roller ROL. The display module DM may include a first area AA1 wound on the roller ROL and a second area AA2 not wound on the roller ROL. The second area AA2 may be spaced apart from the roller ROL and may extend flatly in the first direction DR1.

Hereinafter, a configuration disposed on the lower surface LS of the display module DM may be expressed as a configuration disposed below the display module DM.

The first support bars SB1 and the second support bars SB2 may be alternately disposed. In the periphery of the first area AA1, the first support bars SB1 and the second support bars SB2 may be spaced apart from each other in the first direction DR1. The first support bars SB1 and the second support bars SB2 may be closer to each other as they are adjacent to the second area AA2.

The first support bars SB1 and the second support bars SB2 may be adjacent to each other under the second area AA2 and may be alternately disposed in the first direction DR1 in a same space defined between the first support film SFM1 and the second support film SFM2. Accordingly, one second support bar SB2 may be disposed between two adjacent first support bars SB1.

A first guide groove GG1 may be disposed under the second area AA2. Similar to the structure shown in FIGS. 19 and 20, opposite sides of the first and second support bars SB1 and SB2 opposite to each other in the second direction DR2 may be disposed in the first guide grooves GG1. In an embodiment, as shown in FIG. 23, the first and second protrusion parts PRT1 and PRT2 protruding from opposite sides of the first and second support bars SB1 and SB2 may be disposed in the first guide groove GG1, for example.

Referring to FIGS. 19 to 23, the first protrusion parts PRT1 may be disposed in the first guide groove GG1 and the second guide groove GG2 to move along the first guide groove GG1 and the second guide groove GG2. The second protrusion parts PRT2 may be disposed in the first guide groove GG1 and the third guide groove GG3 to move along the first guide groove GG1 and the third guide groove GG3.

Since the first protrusion parts PRT1 are disposed in the first and second guide grooves GG1 and GG2, the first support bars SB1 and the first support film SFM1 may be disposed along the first and second guide grooves GG1 and GG2. Accordingly, the first support film SFM1 may have a shape similar to that of the first and second guide grooves GG1 and GG2. The first support film SFM1 may include a first part PT1 disposed under the second area AA2, and a first sub part SPT1 and a first rolling part ROP1 extending from the first part PT1.

The first part PT1 may extend in the first direction DR1. The first rolling part ROP1 is spaced apart from the first part PT1 in the third direction DR3 and is bent in a curved shape to have a rolled shape. The first sub part SPT1 may extend from one end of the first part PT1 to the first rolling part ROP1 in the third direction DR3. The first rolling part ROP1 may be extended from one end of the first sub part SPT1 and rolled.

Since the second protrusion parts PRT2 are disposed in the first and third guide grooves GG1 and GG3, the second support bars SB2 and the second support film SFM2 may be disposed along the first and third guide grooves GG1 and GG3. Accordingly, the second support film SFM2 may have a shape similar to that of the first and third guide grooves GG1 and GG3. The second support film SFM2 may include a second part PT2 disposed under the second area AA2, and a second sub part SPT2 and a second rolling part ROP2 extending from the second part PT2.

The second part PT2 may extend in the first direction DR1. The second rolling part ROP2 is spaced apart from the second part PT2 in the third direction DR3 and is bent in a curved shape to have a rolled shape. The second sub part SPT2 may extend from one end of the second part PT2 to the second rolling part ROP2 in the third direction DR3. The second rolling part ROP2 may be extended from one end of the second sub part SPT2 and rolled.

The first support bars SB1 disposed on the lower surface of the first rolling part ROP1 may be arranged in a rolled shape along the first rolling part ROP1. The lower surface of the first rolling part ROP1 may correspond to one surface of the first sub part SPT1 extending in the third direction DR3 from the first rolling part ROP1 and facing the second sub part SPT2. The second support bars SB2 disposed on the upper surface of the second rolling part ROP2 may be arranged in a rolled shape along the second rolling part ROP2. The upper surface of the second rolling part ROP2 may correspond to one surface of the second sub part SPT2 extending in the third direction DR3 from the second rolling part ROP2 and facing the first sub part SPT1.

The first protrusion parts PRT1 and the second protrusion parts PRT2 move along the second and third guide grooves GG2 and GG3, and may become closer to each other as they are adjacent to the first guide groove GG1. The first protrusion parts PRT1 and the second protrusion parts PRT2 may be alternately disposed in the first guide groove GG1 in the first direction DR1.

Accordingly, the first support bars SB1 and the second support bars SB2 may become closer to each other as they are adjacent to the first and second parts PT1 and PT2 from the first and second rolling parts ROP1 and ROP2. Also, the first support bars SB1 and the second support bars SB2 may be adjacent to each other between the first part PT1 and the second part PT2 and may be alternately disposed in the first direction DR1.

Illustratively, although the structure of the first and second support parts SUP1 and SUP2 disposed in the first, second, and third guide grooves GG1, GG2, and GG3 has been described, the invention is not limited thereto. In an embodiment, the first support part SUP1 and the second support part SUP2 may be wound on the rollers, respectively, and may be unwound from the rollers as necessary, for example.

When the second support part SUP2 is not used and only the first support part SUP1 is used, a space may be defined between the first support bars SB1 spaced apart from each other in the first direction DR1. In this case, the flatness of the second area AA2 of the display module DM may decrease due to the space between the first support bars SB1. In an embodiment of the invention, as the second support bars SB2 are disposed in the space between the first support bars SB1 under the second area AA2, the second area AA2 of the display module DM may be supported more flatly.

The first support bars SB1 and the second support bars SB2 may be easily disposed to be spaced apart from each other through the second and third guide grooves GG2 and GG3 spaced apart from each other. The first and second support bars SB1 and SB2 may be alternately disposed by moving to the first guide groove GG1 in an operation mode for the display module DM to be drawn out, when necessary. Accordingly, the first and second support bars SB1 and SB2 spaced apart from each other may move to the first guide groove GG1 when necessary to easily support the display module DM.

Figure 24:
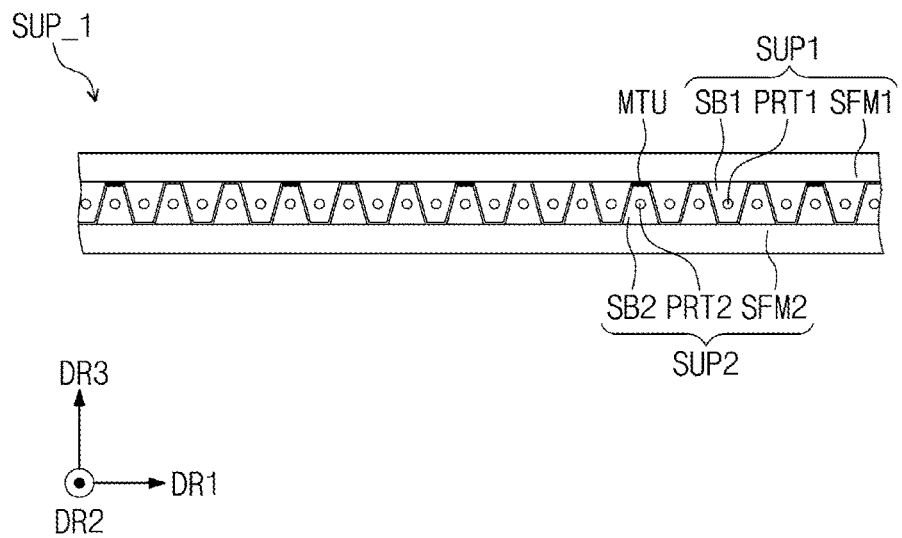
FIGS. 24 and 25 are views showing an embodiment of the configuration of a support part according to the invention.
Figure 25:
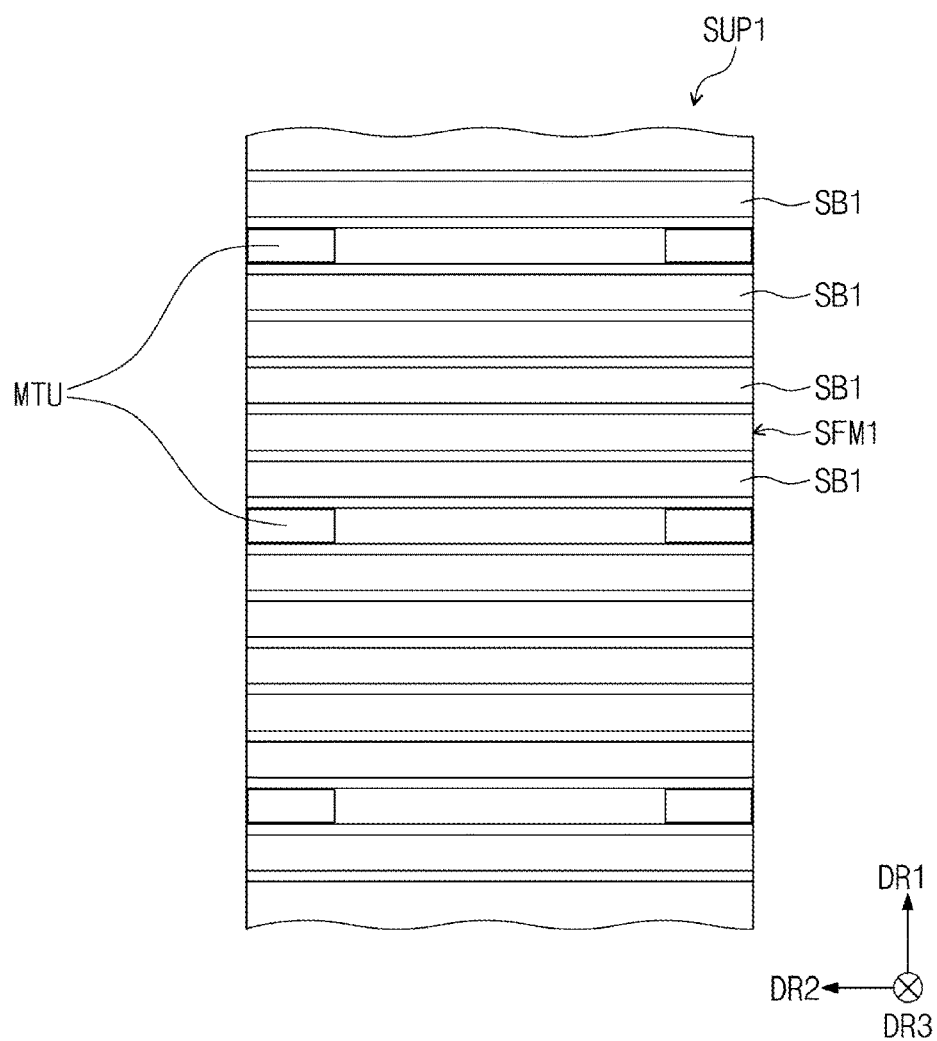

FIGS. 24 and 25 are views showing an embodiment of the configuration of a support part according to the invention.

Hereinafter, the configuration of the support part SUP_1 shown in FIGS. 24 and 25 will be described mainly with a configuration different from the support part SUP shown in FIG. 16. In addition, the same components are shown using the same symbol.

Referring to FIGS. 24 and 25, the support part SUP_1 may include a first support part SUP1 and a second support part SUP2, and the first support part SUP1 may include a first support film SFM1, a plurality of first support bars SB1, and a plurality of first protrusion parts PRT1. The second support part SUP2 may include a second support film SFM2, a plurality of second support bars SB2, and a plurality of second protrusion parts PRT2. The configuration of the first and second support parts SUP1 and SUP2 may be substantially the same as that of the first and second support parts SUP1 and SUP2 illustrated in FIG. 16.

The support part SUP_1 may further include a plurality of magnet units MTU. The magnet units MTU may be disposed between the first support bars SB1 and between the second support bars SB2 and the first support film SFM1. The magnet units MTU may be disposed on the lower surface of the first support film SFM1 to be attached to the lower surface of the first support film SFM1. The magnet units MTU may be spaced apart from each other in the second direction DR2 and arranged in the first direction DR1.

The magnet units MTU may be disposed between some of the first support bars SB1. In an embodiment, the magnet units MTU are disposed between the (a×k)-th first support bar SB1 and the ((a×x)+1)-th first support bar SB1, for example. Here, a is a natural number greater than 2 and may be a constant, and k may be a natural number.

The second support bars SB2 may be attached to the magnet units MTU by magnetic force of the magnet units MTU. Accordingly, the second support bars SB2 may be more easily aligned.

Figure 26:
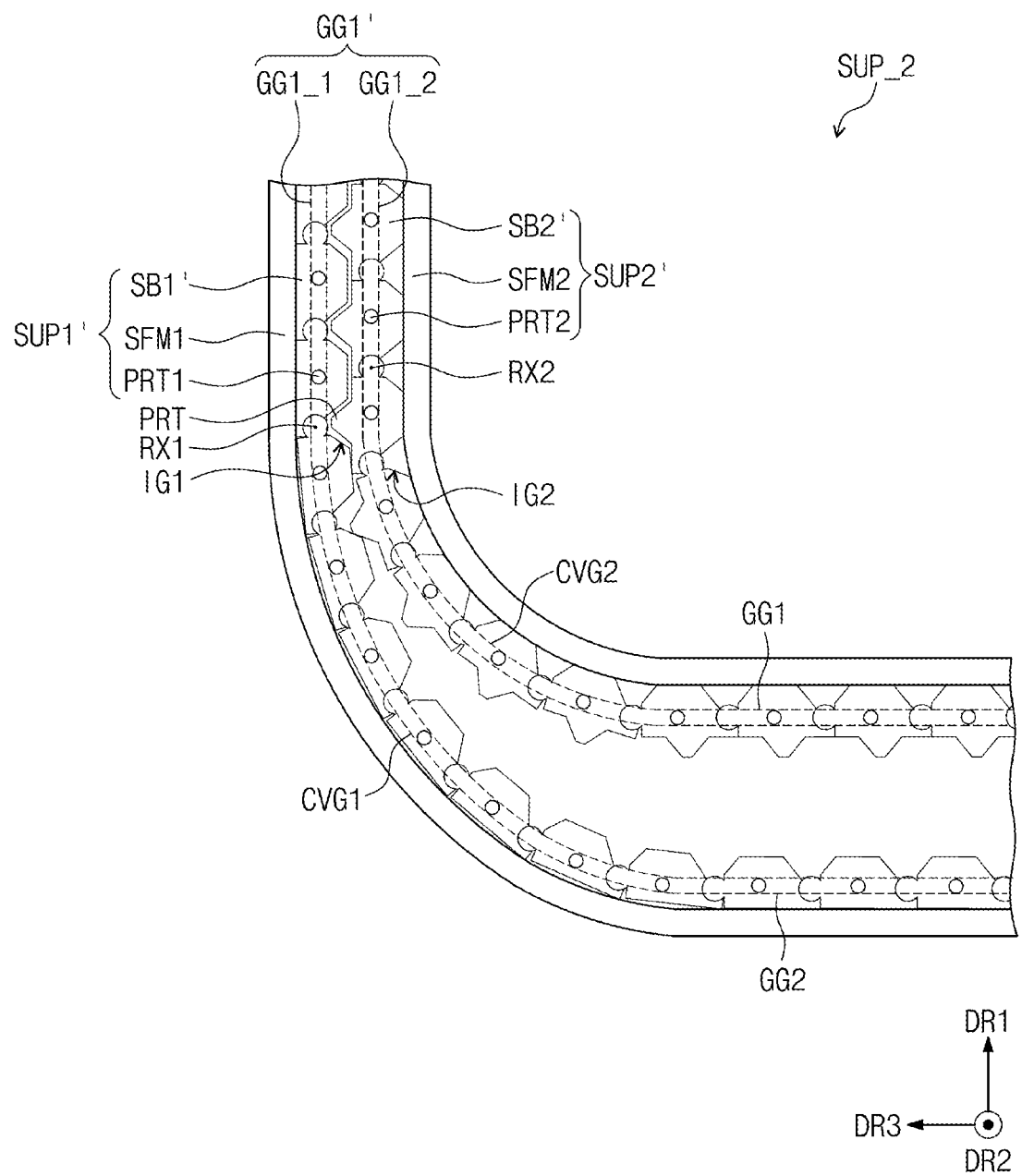
FIG. 26 is a view showing an embodiment of the configuration of a support part according to the invention.
Figure 27:
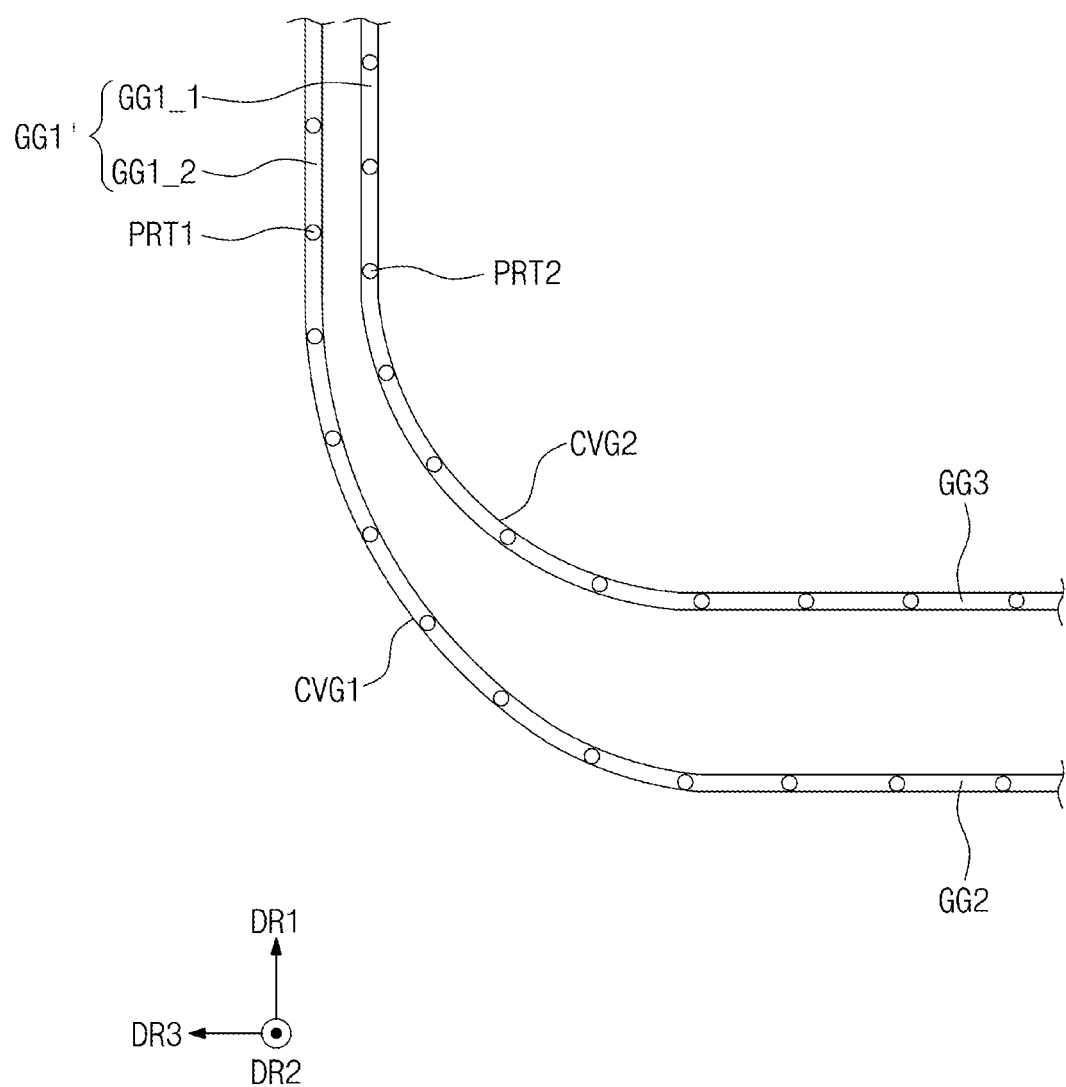
FIG. 27 is a view illustrating a first guide part on which the first and second protrusion parts shown in FIG. 26 are disposed.

FIG. 26 is a view showing an embodiment of the configuration of a support part according to the invention. FIG. 27 is a view illustrating a first guide part on which the first and second protrusion parts shown in FIG. 26 are disposed.

Hereinafter, the configuration of the support part SUP_2 shown in FIGS. 26 and 27 will be described mainly with a configuration different from the support part SUP shown in FIG. 16. In addition, the same components are shown using the same symbol. In an embodiment, the first guide groove GG1" is illustrated by a dotted line in FIG. 26.

Referring to FIG. 26, the support part SUP_2 may include a first support part SUF1' and a second support part SUP2'. The first support part SUP1" may include a first support film SFM1, a plurality of first support bars SB1", and a plurality of first protrusion parts PRT1. The second support part SUP2' may include a second support film SFM2, a plurality of second support bars SB2', and a plurality of second protrusion parts PRT2.

The configuration of the first and second support films SFM1 and SFM2 and the first and second protrusion parts PRT1 and PRT2 may be substantially the same as that of the first and second support films SFM1 and SFM2 and the first and second protrusion parts PRT1 and PRT2 illustrated in FIG. 16.

The first support bars SB1" may be disposed on a lower surface of the first support film SFM1 facing the second support film SFM2. The second support bars SB2" may be disposed on an upper surface of the second support film SFM2 facing the first support film SFM1. The first and second support bars SB1" and SB2" may be disposed between the first support film SFM1 and the second support film SFM2.

The first support bars SB1' may be disposed on upper surfaces of the second support bars SB2'. The first support bars SB1" may be alternately disposed with the second support bars SB2". When viewed from the second direction DR2, the first support bars SB1" may be coupled to each other to rotate about the first rotational axes RX1 parallel to the second direction DR2. The second support bars SB2" may be coupled to each other to rotate about second rotational axes RX2 parallel to the second direction DR2.

The second support part SUP2' may further include a plurality of protrusion parts PRT protruding from upper surfaces of the second support bars SB2' facing the first support bars SB1'. The protrusion part PRT protruding from the h-th second support bar SB2' may be disposed between the h-th first support bar SB1' and the (h+1)-th first support bar SB1'. Here, h is a natural number.

One surface of the first support bars SB1" facing the second support bars SB2" may be defined as lower surfaces of the first support bars SB1". One side of the h-th first support bar SB1' adjacent to the lower surface of the h-th first support bar SB1' and one side of the (h+1)-th first support bar SB1' adjacent to the lower surface of the (h+1)-th first support bar SB1' may be spaced apart from each other to face each other and have an inclined surface.

The protrusion part PRT protruding from the upper surface of the h-th second support bar SB2' may be disposed in the first insertion groove IG1 defined between one side of the h-th first support bar SB1' and one side of the (h+1)-th first support bar SB1'. When viewed from the second direction DR2, each of the protrusion parts PRT and the first insertion grooves IG1 may have a trapezoidal shape. Since the first insertion grooves IG1 are defined between the first support bars SB1", the first support bars SB1" may be easily disposed in the first curved groove CVG1.

One surfaces of the second support bars SB2' facing the second support film SFM2 may be defined as lower surfaces of the second support bars SB2'. One side of the h-th second support bar SB2' adjacent to the lower surface of the h-th second support bar SB2' and one side of the (h+1)-th second support bar SB2' adjacent to the lower surface of the (h+1)-th second support bar SB2' may be spaced apart from each other to face each other and have an inclined surface.

A second insertion groove IG2 may be defined between one side of the h-th first support bar SB1' and one side of the (h+1)-th first support bar SB1'. Since the second insertion grooves IG2 are defined between the second support bars SB2', the second support bars SB2' may be easily disposed in the second curved groove CVG2.

Referring to FIGS. 26 and 27, the first guide groove GG1" may include a first sub guide groove GG1_1 and a second sub guide groove GG1_2 that extend in the first direction DR1 and are spaced apart from each other in the third direction DR3.

The second guide groove GG2 may extend from the first sub guide groove GG1_1. The third guide groove GG3 may extend from the second sub guide groove GG1_2. The second and third guide grooves GG2 and GG3 may be the same as the second and third guide grooves GG2 and GG3 illustrated in FIG. 15.

The first protrusion parts PRT1 may be disposed in the first sub guide groove GG1_1 and the second guide groove GG2. The first protrusion parts PRT1 may move along the first sub guide groove GG1_1 and the second guide groove GG2. The second protrusion parts PRT2 may be disposed in the second sub guide groove GG1_2 and the third guide groove GG3. The second protrusion parts PRT2 may move along the second sub guide groove GG1_2 and the third guide groove GG3.

Although described with reference to embodiments, those skilled in the art will appreciate that various modifications and changes may be made to the invention within the scope not departing from the spirit and scope of the invention described in the following claims In addition, the embodiments disclosed in the invention are not intended to limit the technical idea of the invention, and all technical ideas within the scope of the following claims and equivalents should be construed as being included in the scope of the invention.

Since the technology for improving the surface quality of the display module may provide a higher quality image to the user, the invention has high industrial applicability.

The invention claimed is:
1. A display device comprising:
a display module;
a first support film disposed under the display module;
a second support film disposed under the first support film;
a plurality of first support bars disposed on a lower surface of the first support film between the first support film and the second support film;
a plurality of second support bars disposed on an upper surface of the second support film between the first support film and the second support film; and
a roller connected to one end of the display module,
wherein the plurality of first support bars and the plurality of second support bars are alternately arranged, and the display module comprises a first area wound around the roller and separated from the first support film.

2. The display device of claim 1, wherein the plurality of first support bars and the plurality of second support bars are arranged in a first direction and extend in a second direction intersecting the first direction.

3. The display device of claim 2,
wherein the display module further comprises:
a second area extending in the first direction without being wound around the roller;
wherein first support bars and second support bars of the plurality of first and second support bars disposed under the second area are alternately disposed in a same space defined between the first support film and the second support film.

4. The display device of claim 3, wherein the first support film comprises:
a first part disposed below the second area; and
a first rolling part extending from the first part and bent and rolled in a curved shape,
wherein the second support film comprises:
a second part disposed under the second area; and
a second rolling part spaced apart from the first rolling part, extending from the second part, and bent and rolled in a curved shape.

5. The display device of claim 4, wherein, the plurality of first support bars and the plurality of second support bars are closer to each other as closer to the first and second parts from the first and second rolling parts,
wherein the plurality of first support bars and the plurality of second support bars are adjacent to each other between the first part and the second part and are alternately disposed in the first direction.

6. The display device of claim 4, wherein first support bars of the plurality of first support bars disposed on the first rolling part are arranged in a rolled shape along the first rolling part, and second support bars of the plurality of second support bars disposed on the second rolling part are arranged in a rolled shape along the second rolling part.

7. The display device of claim 2, further comprising a case accommodating the display module, the first and second support films, and the plurality of first and second support bars,
wherein an opening is defined in the case, and
the display module, the first and second support films, and the plurality of first support bars and the plurality of second support bars are drawn in and out.

8. The display device of claim 7, wherein opposite sides of the plurality of first support bars are disposed in a first guide groove defined in an inner surface of the case facing each other in the second direction and in a second guide groove defined in the inner surface of the case and extending from the first guide groove,
wherein opposite sides of the plurality of second support bars are disposed in the first guide groove and in a third guide groove defined in the inner surface of the case, extending from the first guide groove and spaced apart from the second guide groove.

9. The display device of claim 8, wherein the first guide groove extends in the first direction toward the opening,
wherein the second guide groove and the third guide groove extend from one end of the first guide groove opposite to the opening,
wherein the second guide groove is disposed between the third guide groove and the display module to extend.

10. The display device of claim 9, further comprising:
a plurality of first protrusion parts protruding from the opposite sides of the plurality of first support bars and disposed in the first guide groove and the second guide groove; and
a plurality of second protrusion parts protruding from the opposite sides of the plurality of second support bars and disposed in the first guide groove and the third guide groove,
wherein the plurality of first protrusion parts and the plurality of second protrusion parts move along the first, second, and third guide grooves.

11. The display device of claim 10, wherein the plurality of first protrusion parts and the plurality of second protrusion parts are alternately arranged in the first direction in the first guide groove.

12. The display device of claim 9, wherein the second guide groove comprises:
a first curved groove extending from the one end of the first guide groove, as having a curved shape;
a first sub guide groove extending from one end of the first curved groove in a third direction intersecting a plane defined by the first and second directions; and
a second sub guide groove extending from one end of the first sub guide groove and having a rolled-up shape.

13. The display device of claim 12, wherein the third guide groove comprises:
a second curved groove extending from the one end of the first guide groove as having a curved shape;
a third sub guide groove extending in the third direction from one end of the second curved groove; and
a fourth sub guide groove extending from one end of the third sub guide groove and having a rolled-up shape,
wherein the fourth sub guide groove is disposed between the first guide groove and the second sub guide groove.

14. The display device of claim 7, further comprising:
a coupling part disposed on the case adjacent to the opening and connected to an end of the display module adjacent to the opening and an end of the first and second support films adjacent to the opening; and
a moving part connected to the case and the coupling part,
wherein the moving part moves away from or closer to the opening in the first direction.

15. The display device of claim 2, wherein a plurality of grooves extending in the second direction and arranged in the first direction is defined on a lower surface of the display module.

16. The display device of claim 2, further comprising a plurality of magnet units disposed between the plurality of first support bars and between the plurality of second support bars and the first support film.

17. The display device of claim 16, wherein the plurality of magnet units is disposed between the (a×k)-th first support bar and the ((a×k)+1)-th first support bar, where a is a natural number and constant greater than 2, and k is a natural number.

18. The display device of claim 16, wherein the plurality of magnet units is spaced apart from each other in the second direction and arranged in the first direction.

19. The display device of claim 2, wherein the plurality of first support bars is coupled and rotated with each other about a plurality of first rotational axes parallel to the second direction,
wherein the plurality of second support bars is disposed under the plurality of first support bars and is coupled and rotated with each other about a plurality of second rotational axes parallel to the second direction.

20. The display device of claim 19, further comprising a protrusion part protruding from an upper surface of an h-th second support bar of the plurality of second support bars, where h is a natural number,
- wherein the protrusion part is disposed between an h-th first support bar and an (h+1)-th first support bar of the plurality of first support bars.

21. The display device of claim 20, wherein one side of the h-th first support bar adjacent to a lower surface of the h-th first support bar and one side of the (h+1)-th first support bar adjacent to a lower surface of the (h+1)-th first support bar are spaced apart from each other, face each other and have a slope,
- wherein the protrusion part is disposed in an insertion groove defined between the one side of the h-th first support bar and the one side of the (h+1)-th first support bar,
- wherein one side of the h-th second support bar adjacent to a lower surface of the h-th second support bar and one side of an (h+1)-th second support bar of the plurality of second support bars adjacent to a lower surface of the (h+1)-th second support bar are spaced apart from each other, face each other and have a slope.

22. A display device comprising:
- a roller;
- a display module including a first area wound around the roller and a second area spaced apart from the roller;
- a first support film disposed under the display module;
- a plurality of first support bars disposed on a lower surface of the first support film;
- a second support film disposed under the first support film; and
- a plurality of second support bars disposed on an upper surface of the second support film,
- wherein the plurality of first support bars and the plurality of second support bars are spaced apart from each other around the first area, become closer to each other as the plurality of first support bars and the plurality of second support bars are adjacent to the second area, are adjacent to each other under the second area, and are alternately disposed in a same space defined between the first support film and the second support film, and
- the first area of the display module is separated from the first support film.

23. The display device of claim 22, further comprising a case for accommodating the roller, the display module, the first and second support films, and the first and second support bars,
- wherein opposite sides of first support bars and second support bars of the plurality of first and second support bars disposed under the second area are disposed in a first guide groove defined in an inner surface of the case,
- wherein opposite sides of first support bars of the plurality of first support bars disposed around the first area are disposed in a second guide groove defined in the inner surface of the case and extending from the first guide groove,
- wherein opposite sides of second support bars of the plurality of second support bars disposed around the first area are disposed in a third guide groove defined in the inner surface of the case and extending from the first guide groove.

* * * * *